(12) United States Patent
Wang et al.

(10) Patent No.: US 12,394,600 B2
(45) Date of Patent: Aug. 19, 2025

(54) BALANCED RF RESONANT ANTENNA SYSTEM

(71) Applicant: Tokyo Electron Limited, Tokyo (JP)

(72) Inventors: Qiang Wang, Austin, TX (US); Michael Hummel, Austin, TX (US); Peter Lowell George Ventzek, Austin, TX (US); Shyam Sridhar, Austin, TX (US); Mitsunori Ohata, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 18/308,877

(22) Filed: Apr. 28, 2023

(65) Prior Publication Data
US 2024/0363310 A1    Oct. 31, 2024

(51) Int. Cl.
*H01J 37/32* (2006.01)
*H01Q 5/10* (2015.01)

(52) U.S. Cl.
CPC .. *H01J 37/32183* (2013.01); *H01J 37/32091* (2013.01); *H01Q 5/10* (2015.01)

(58) Field of Classification Search
CPC ........... H01J 37/32183; H01J 37/32091; H01J 37/3211; H01Q 5/10
See application file for complete search history.

(56) References Cited

U.S. PATENT DOCUMENTS

| | | | |
|---|---|---|---|
| 5,965,034 A | 10/1999 | Vinogradov et al. | |
| 6,259,209 B1 | 7/2001 | Bhardwaj et al. | |
| 9,313,872 B2 | 4/2016 | Yamazawa et al. | |
| 10,354,838 B1 | 7/2019 | Mopidevi et al. | |
| 11,251,021 B2 | 2/2022 | Ventzek et al. | |
| 2002/0189763 A1 | 12/2002 | Kwon | |
| 2020/0118792 A1* | 4/2020 | Mopidevi | H01L 21/67069 |
| 2021/0005429 A1 | 1/2021 | Tanabe | |
| 2022/0051878 A1* | 2/2022 | Sekiya | H01J 37/18 |

(Continued)

FOREIGN PATENT DOCUMENTS

| | | | | |
|---|---|---|---|---|
| EP | 0838839 B1 | | 5/2008 | |
| JP | 2010519448 A | * | 6/2010 | B01J 19/08 |
| KR | 20110041352 A | * | 4/2011 | |

(Continued)

OTHER PUBLICATIONS

US 11,335,544 B2, 05/2022, Inoue et al. (withdrawn)

(Continued)

*Primary Examiner* — Abdullah A Riyami
*Assistant Examiner* — Syed M Kaiser
(74) *Attorney, Agent, or Firm* — Slater Matsil, LLP

(57) ABSTRACT

According to an embodiment, a plasma processing system includes a plasma chamber, an RF source, a matching circuit, a balun, and a resonating antenna. The resonating antenna includes a first and a second spiral resonant antenna (SRA), each having an electrical length corresponding to a quarter of a wavelength of a frequency of a forward RF wave generated by the RF source. The first end of the first SRA is coupled to a first balanced terminal of the balun and the second end of the first SRA is open circuit. The first end of the second SRA is coupled to a second balanced terminal of the balun and the second end of the second SRA is open circuit. The first and the second SRA are arranged in a symmetrically nested configuration having a same center point.

20 Claims, 10 Drawing Sheets

(56) References Cited

U.S. PATENT DOCUMENTS

2022/0068601 A1* 3/2022 Ventzek .............. H01J 37/3244
2023/0054430 A1 2/2023 Lane

FOREIGN PATENT DOCUMENTS

KR 101280468 B1 7/2013
KR 20150122063 A 10/2015

OTHER PUBLICATIONS

International Search Report and Written Opinion, PCT/US2024/013044, mailed Jun. 5, 2024, Total pp. 10.
International Search Report and Written Opinion, PCT/US2024/049869, mailed Jan. 3, 2025, Total pp. 13.

* cited by examiner

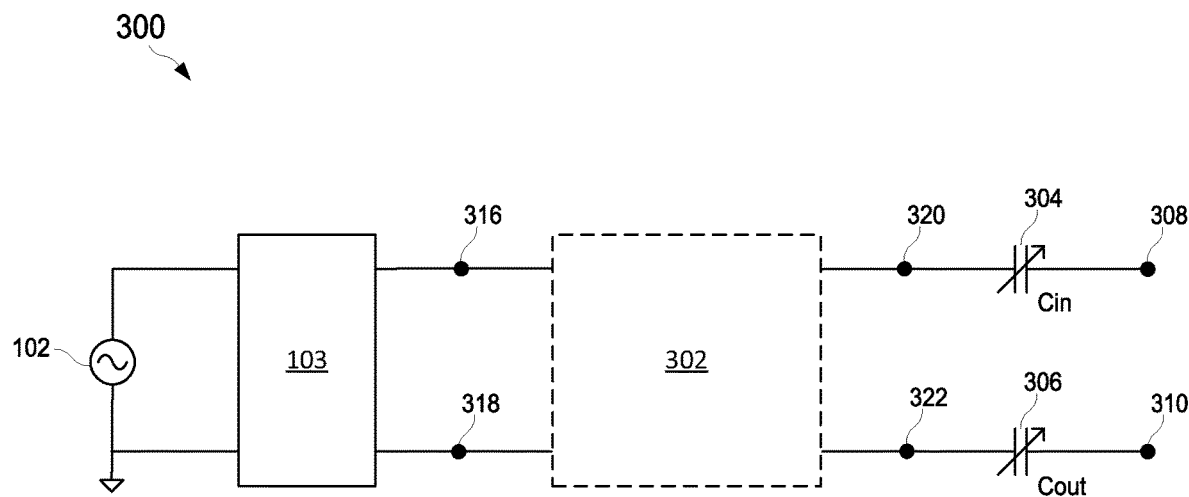
FIG. 3
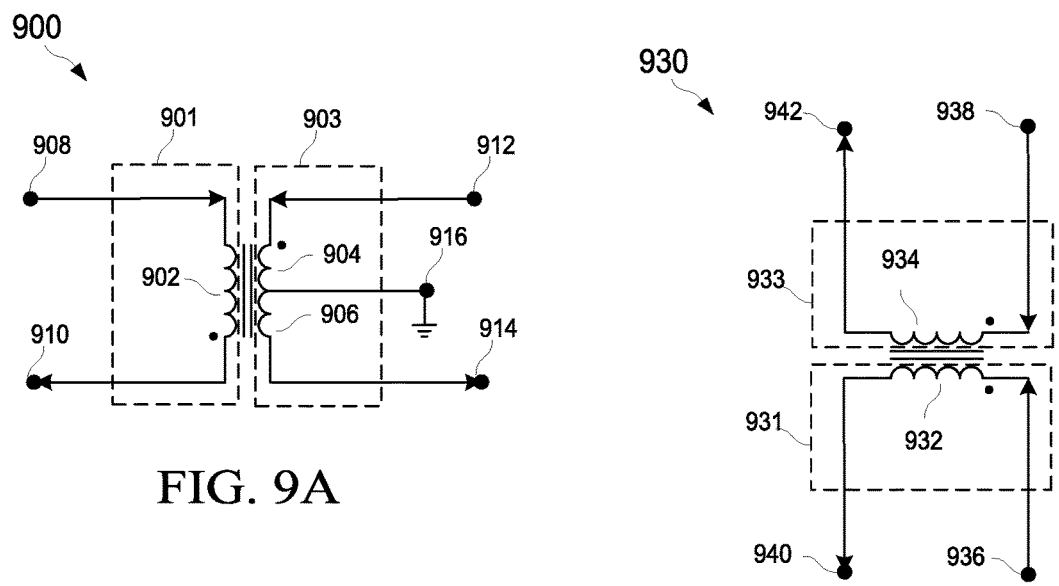
FIG. 9A
FIG. 9B

BALANCED RF RESONANT ANTENNA SYSTEM

TECHNICAL FIELD

The present disclosure generally relates to plasma processing and, in particular embodiments, to a balanced RF resonant antenna system.

BACKGROUND

Plasma processing is extensively used in the manufacturing and fabricating of high-density microscopic circuits within the semiconductor industry. In a plasma processing system, an electromagnetic wave radiated into a plasma chamber generates an electromagnetic field. The generated electromagnetic field heats electrons in the chamber. The heated electrons ignite plasma that treats the substrate in a process such as etching, deposit, oxidation, sputtering, or the like.

A non-uniform electromagnetic field within the plasma processing chamber results in a non-uniform treatment of the substrate due to different portions of the substrate being treated with varying plasma densities. An apparatus and system that improves the uniformity of the electromagnetic field in a plasma processing system are, thus, desirable.

SUMMARY

Technical advantages are generally achieved by embodiments of this disclosure which describe a balanced RF resonant antenna system.

A first aspect relates to a plasma processing system. The plasma processing system includes a plasma chamber, an RF source, a matching circuit, a balun, and a resonating antenna. The RF source is configured to generate a forward RF wave. The matching circuit is coupled to the RF source and is configured to provide matching for the RF source. The balun includes unbalanced terminals coupled to the matching circuit. The resonating antenna is configured to generate plasma within the plasma chamber and includes a first spiral resonant antenna and a second spiral resonant antenna. The first spiral resonant antenna has an electrical length corresponding to a quarter of a wavelength of a frequency of the forward RF wave, a first end and a second end. The first end is coupled to a first balanced terminal of the balun and the second end is an open circuit. The second spiral resonant antenna has an electrical length corresponding to a quarter of the wavelength of the frequency of the forward RF wave, a first end and a second end. The first end is coupled to a second balanced terminal of the balun and the second end is an open circuit. The first spiral resonant antenna and the second spiral resonant antenna are arranged in a symmetrically nested configuration having the same center point.

A second aspect relates to a resonating antenna for generating plasma within a plasma chamber. The resonating antenna includes a first spiral resonant antenna having an electrical length corresponding to a quarter of a wavelength of a frequency of a forward RF wave fed by an RF source couplable to the resonating antenna. The first spiral resonant antenna has a first end and a second end. The first end couplable to a first balanced terminal of a balun and the second end is an open circuit. The second spiral resonant antenna has an electrical length corresponding to a quarter of the wavelength of the frequency of the forward RF wave. The second spiral resonant antenna has a first and second end, the first end couplable to a second balanced terminal of the balun and the second end is an open circuit. The first spiral resonant antenna and the second spiral resonant antenna are arranged in a symmetrically nested configuration having the same center point.

A third aspect relates to an apparatus for generating plasma in a plasma chamber of a plasma processing system. The apparatus includes an RF source configured to generate a forward RF wave; a matching circuit coupled to the RF source, the matching circuit configured to provide matching for the RF source; a balun having unbalanced terminals coupled to the matching circuit; a resonating antenna, the resonating antenna configured to generate plasma within the plasma chamber, the resonating antenna having: a first spiral resonant antenna having an electrical length corresponding to a quarter of a wavelength of a frequency of the forward RF wave, the first spiral resonant antenna having a first end and a second end, the first end coupled to a first balanced terminal of the balun and the second end that is open circuit, and a second spiral resonant antenna having an electrical length corresponding to the quarter of the wavelength of the frequency of the forward RF wave, the second spiral resonant antenna having a first end and a second end, the first end coupled to a second balanced terminal of the balun and the second end that is open circuit, wherein the first spiral resonant antenna and the second spiral resonant antenna are arranged in a symmetrically nested configuration having a same center point; a non-transitory memory storage comprising instructions; and a processor in communication with the non-transitory memory storage and coupled to the matching circuit, wherein the instructions, when executed by the processor, cause the processor to provide a matching impedance between the RF source and the resonating antenna.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which:

FIG. 3 is a schematic of an embodiment circuit;

FIG. 9A is a schematic of an embodiment voltage balun transformer;

FIG. 9B is a schematic of an embodiment current balun transformer; and

DETAILED DESCRIPTION OF ILLUSTRATIVE EMBODIMENTS

Figure 1:
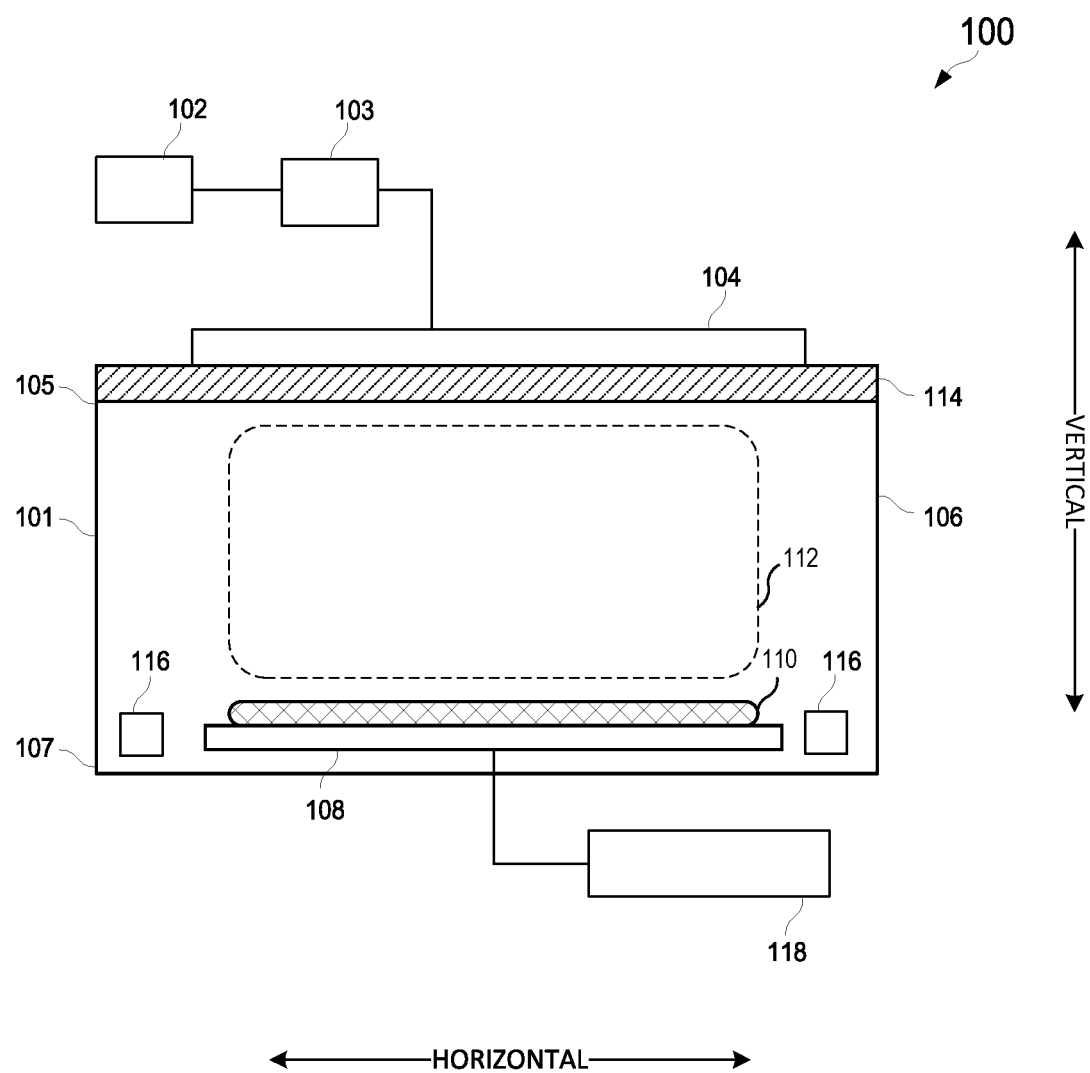
FIG. 1 is a diagram of an embodiment plasma processing system.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While inventive aspects are described primarily in the context of resonating in a plasma processing system, the inventive aspects may similarly apply to fields outside the semiconductor industry. Plasma can treat and modify surface properties through functional group addition. For example, to treat surfaces for paint deposits, plasma can convert hydrophobic surfaces to hydrophilic surfaces. Further, the inventive aspects are not limited to plasma. For example, RF can be used to thaw frozen food or dry textiles, food, wood, or the like.

Embodiments of this disclosure advantageously provide a more uniform near-field electromagnetic flux (i.e., Poynting vector) than conventional systems, which results in, for example, improved plasma azimuthal uniformity. In embodiments, a balun transformer-based matching network is provided that advantageously delivers balanced currents to each section of the radiating antenna (generating the near-field electromagnetic flux), resulting in improved system stability.

Aspects of the disclosure provide a balanced circuit coupled to a resonating antenna. The resonating antenna includes a pair of quarter wavelength coils. The balanced circuit includes a balanced to unbalanced transformer (i.e., balun) coupled to a matching network. The combination of the balun and the matching network results in a balanced current in each coil section. The improvement in current balance in each coil, in comparison to the conventional systems, improves the plasma density uniformity in the plasma chamber.

In embodiments, a plasma processing system includes a plasma chamber, an RF source, a matching circuit, a balun, and a resonating antenna. The RF source is configured to generate a forward RF wave. The matching circuit is coupled to the RF source and is configured to provide matching for the RF source. The balun includes unbalanced terminals coupled to the matching circuit. The resonating antenna is configured to generate plasma within the plasma chamber and includes a first spiral resonant antenna and a second spiral resonant antenna.

In embodiments, the first and second spiral resonant antennas have an electrical length corresponding to a quarter of a wavelength of a frequency of the forward RF wave. Each of the spiral resonant antennas has a corresponding first end and a second end. The first end of the first spiral resonant antenna is coupled to a first balanced terminal of the balun and the second end of the first spiral resonant antenna is an open circuit. The first end of the second spiral resonant antenna is coupled to a second balanced terminal of the balun and the second end of the second spiral resonant antenna is an open circuit. The first spiral resonant antenna and the second spiral resonant antenna are arranged in a symmetrically nested configuration having the same center point. These and further details are discussed in greater detail below.

FIG. 1 illustrates a diagram of an embodiment plasma processing system 100. Plasma processing system 100 includes an RF source 102, a radiating antenna 104, a plasma chamber 106, and, optionally, a dielectric plate 114, which may (or may not) be arranged as shown in FIG. 1. Further, plasma processing system 100 may include additional components not depicted in FIG. 1. The plasma processing system 100, in embodiments, may be housed within an enclosure, which may be a Faraday cage or a solid enclosure.

RF source 102 provides forward RF waves to the radiating antenna 104. The forward RF waves travel through the radiating antenna 104 and are transmitted (i.e., radiated) towards plasma chamber 106. In embodiments, the operating frequency of RF source 102 is set, but not limited to, 1 megahertz (MHz) to 400 MHz. In an embodiment, RF source 102 operates at 13.56 MHz. In an embodiment, RF source 102 operates at 27 MHz. In embodiments, the RF source 102 is a pulse-modulated. In such embodiments, the modulation frequency range is between, but not limited to, 10 hertz (Hz) and 20 kilohertz (20 kHz), inclusive. In embodiments, the modulation duty ratio range is between 10 and 90%, inclusive.

The plasma chamber 106 may include sidewalls 101, a base 107, and a top cover 105, which may be made of a conductive material, for example, stainless steel or aluminum coated with a film, such as yttria (e.g., $Y_xO_y$ or $Y_xO_yF_z$, etc.), or a film consistent with the process (e.g., carbon, silicon, etc.), or as known to a person of ordinary skill in the art. In embodiments, plasma chamber 106 is cylindrical with a base 107 and a top cover 105 that are circular.

The plasma chamber 106 includes a substrate holder 108 (i.e., chuck). As shown, substrate 110 is placed on substrate holder 108, positioned at the base 107 of the plasma chamber 106, to be processed. Optionally, plasma chamber 106 may include a bias power supply 118 coupled to the substrate holder 108. Optionally, plasma chamber 106 may include one or more pump outlets 116 to remove byproducts from plasma chamber 106 through selective control of gas flow rates within. In embodiments, pump outlets 116 are placed near (e.g., below/around the perimeter of) substrate holder 108 and substrate 110. In embodiments, plasma chamber 106 may include additional substrate holders (not shown). In embodiments, the placement of the substrate holder 108 may differ from that shown in FIG. 1. Thus, the quantity and position of the substrate holder 108 are non-limiting.

In embodiments, radiating antenna 104 is separated from the top cover 105 of the plasma chamber 106 by the dielectric plate 114 (i.e., a dielectric window), typically made of a dielectric material such as quartz. Dielectric plate 114 separates the low-pressure environment within plasma chamber 106 from the external atmosphere. It should be appreciated that radiating antenna 104 can be placed directly adjacent to the top cover 105 of the plasma chamber 106, or radiating antenna 104 can be separated from plasma chamber 106 by air. In embodiments, the dielectric plate 114 is selected to minimize reflections of the RF wave from the plasma chamber 106. In other embodiments, the radiating antenna 104 is embedded within the dielectric plate 114.

In embodiments, radiating antenna 104 radiates an electromagnetic field towards the plasma chamber 106. The radiated electromagnetic field generates a high-density plasma 112. In embodiments, the excitation frequency of the radiating antenna 104 is in the radio frequency range (1-400 MHz), which is not limiting, and other frequency ranges can similarly be contemplated. For example, inventive aspects disclosed herein equally apply to applications in the microwave frequency range.

In embodiments, the radiating antenna 104 includes resonating coils. The resonating coils can be circular and coupled to RF source 102 through an intermediary circuit.

The resonating antennas are resonant with electromagnetic waves fed from the RF source 102.

In embodiments, the resonating coils of the radiating antenna 104 are arranged about a central axis of symmetry. In an embodiment, the central axis of symmetry is perpendicular to the dielectric plate 114. In an embodiment where the dielectric plate 114 is in the shape of a disk, the central axis of symmetry passes through the disk's center.

In embodiments, RF source 102 couples energy to an interface of the radiating antenna 104 to generate the standing electromagnetic waves from the radiating antenna 104. The RF source 102 is coupled to the interface via a transmission line in embodiments. It is desirable that the interface maintain the same or higher symmetry as the elements of the radiating antenna 104 under rotation about the axis of symmetry.

In an embodiment, the radiating antenna 104 couples RF power from RF source 102 to the plasma chamber 106 to treat substrate 110. In particular, radiating antenna 104 radiates an electromagnetic wave in response to being fed the forward RF waves from the RF source 102. The radiated electromagnetic wave penetrates from the atmospheric side (i.e., radiating antenna 104 side) of the dielectric plate 114 into plasma chamber 106. The radiated electromagnetic wave generates an electromagnetic field within the plasma chamber 106. The generated electromagnetic field ignites and sustains plasma 112 by transferring energy to free electrons within plasma chamber 106. The plasma 112 can be used to, for example, selectively etch or deposit material on substrate 110.

In FIG. 1, radiating antenna 104 is external to the plasma chamber 106. In embodiments, however, radiating antenna 104 can be placed internally in plasma chamber 106. In embodiments, radiating antenna 104 is a resonating antenna, operating, for example, at its resonant frequency.

In embodiments, the operating frequency of radiating antenna 104 is between 5 and 100 megahertz (MHz). In embodiments, the power delivered by radiating antenna 104 ranges from 10 to 5000 Watts (W)—determined by various factors such as distance from the radiating antenna 104, impedance values, or the like.

Figure 2:
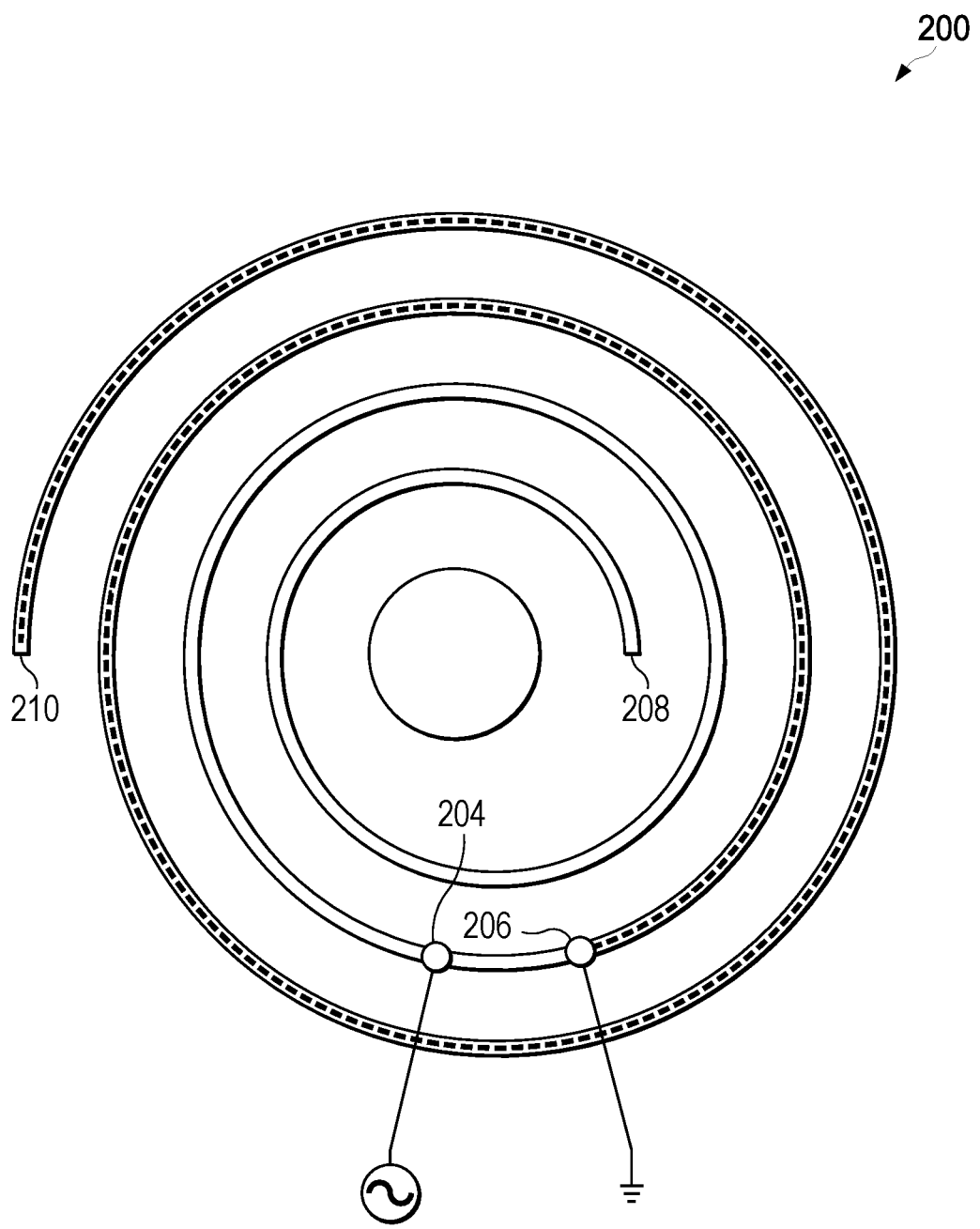
FIG. 2 is a resonating antenna of a conventional coil-based system.

FIG. 2 illustrates a resonating antenna 200 of a conventional coil-based system. Resonating antenna 200 is arranged as a half-wave resonant antenna. Resonating antenna 200 is a spiral conductive structure with an electrical length that is substantially equal to a half resonant frequency wavelength (i.e., half-wave). A uniform transmission line, similar to the resonating antenna 200, of length L, terminated by open circuits at the two ends is a half-wavelength resonator. A half-wavelength resonator exhibits resonance at discrete frequencies corresponding to L being equal to a multiple of one-half of a wavelength ($\lambda$) or L=n×$\lambda$/2, where n is a whole number.

Resonating antenna 200 includes multiple taps along its length, which allows a circuit to make physical and electrical contact with the resonating antenna 200. RF source 102 is couplable to the first node 204 via the matching circuit 103 and RF ground is couplable to the second node 206. The ends of the resonating antenna 200 are labeled as the third node 208 (i.e., at the inner portion of the spiral conductive structure) and the fourth node 210 (i.e., at the outer portion of the spiral conductive structure). The third node 208 and the fourth node 210 are left floating (i.e., open circuit). The first node 204 and second node 206 are arranged such that they are equidistant from the ends (i.e., third node 208 and fourth node 210) of the spiral conductive structure along the length of the resonating antenna 200.

The first node 204 and second node 206 effectively split the resonating antenna 200 into two coils: (i) an inner coil portion from the first node 204 to the third node 208, at one end of the resonating antenna 200 and (ii) an outer coil portion from the second node 206 to the fourth node 210, at a second end of the resonating antenna 200.

Due to the asymmetry in the layout of resonating antenna 200, the plasma generated could be non-uniform. Further, as the current flowing through the inner coil portion and outer coil portion could be unbalanced under certain operating conditions, the non-uniformity of the plasma generated by resonating antenna 200 is increased.

FIG. 3 illustrates a schematic of an embodiment circuit 300. Circuit 300 includes the RF source 102, the matching circuit 103, a balun (balanced-to-unbalanced conversion circuit) 302, and, optionally, a capacitor 304 and a capacitor 306 which may (or may not) be arranged as shown. Circuit 300 may include additional components not shown, such as inductors. Circuit 300 is couplable, at the first terminal 308 and the second terminal 312, to the radiating antenna 104. In embodiments, the optional capacitors 304, 306 are replaced with inductors.

RF source 102 includes an RF power supply, which may include a generator circuit. In embodiments, RF source 102, matching circuit 103, balun 302, and capacitors 304, 306 are coupled via a power transmission line, such as a coaxial cable, or the like. RF source 102 is configured to generate a forward RF wave to the radiating antenna 104 couplable to circuit 300 at terminals 308, 312.

When a wave travels through a medium, an impedance discontinuity caused, for example, by a transition from one medium to another results in a portion of the wave being reflected into the original medium from which the wave is traveling. The parameter used to define this ratio is the reflection coefficient. It is advantageous for RF power from the RF source 102 to be fed to the plasma chamber 106 with minimal reflection and for the reflection coefficient at the impedance discontinuities to be as low as possible.

An impedance associated with the plasma 112, generated in the plasma chamber 106, corresponds to the load of the radiating antenna 104 during its operation. The impedance of the plasma 112 can vary based on, for example, changes in pressure, temperature, increased or decreased gas flow rates, or operating conditions.

Typically, a matching circuit 103 (auto or manual) coupled to the radiating antenna 104 is used to minimize losses (i.e., reflected power) in response to changes in the load condition. Matching circuit 103 may include one or more transformers, resistor networks, capacitors, inductors (i.e., reactive components), or fixed-length transmission lines, which may be arranged as known in the art. In embodiments, the components are adjustable (e.g., variable capacitors, etc.) that allow the matching circuit 103 to be updated (i.e., provide a variable impedance) based on the operating condition (e.g., operating frequency) of the plasma processing system 100. In some embodiments, an automatic (i.e., dynamic) tuning algorithm controls the operation and configuration of the matching circuit 103. In embodiments, the matching circuit 103 is manually configured based on the operating condition of the plasma processing system 100.

Balun 302 allows for a differential, balanced RF functional block, for example, the resonating antennas in the present disclosure, to couple to the single-ended, ground-reference (e.g., RF source 102/matching circuit 103 and RF ground). In embodiments, balun 302 is configured to match the balanced impedance at the radiating antenna 104 to the unbalanced impedance of the RF source 102 and its associated circuits (i.e., including matching circuit 103), which are configured to deliver the RF power to the radiating antenna 104. The unbalanced terminals of the balun 302 are coupled to the matching circuit 103 via terminals 316 and 318 and the balanced terminals of the balun 302 are coupled to the capacitors 304 and 306 via terminals 320 and 322.

In embodiments, circuit 300 includes blocking capacitors 304 and 306 that block a DC current flowing between the balun 302 and the radiating antenna couplable at terminals 308, 312. Capacitors 304, 306, and balun 302, combined with the matching circuit 103, provide an improved circuit 300 for matching RF source 102 with a radiating antenna 104 couplable at terminals 308 and 312.

Figure 4:
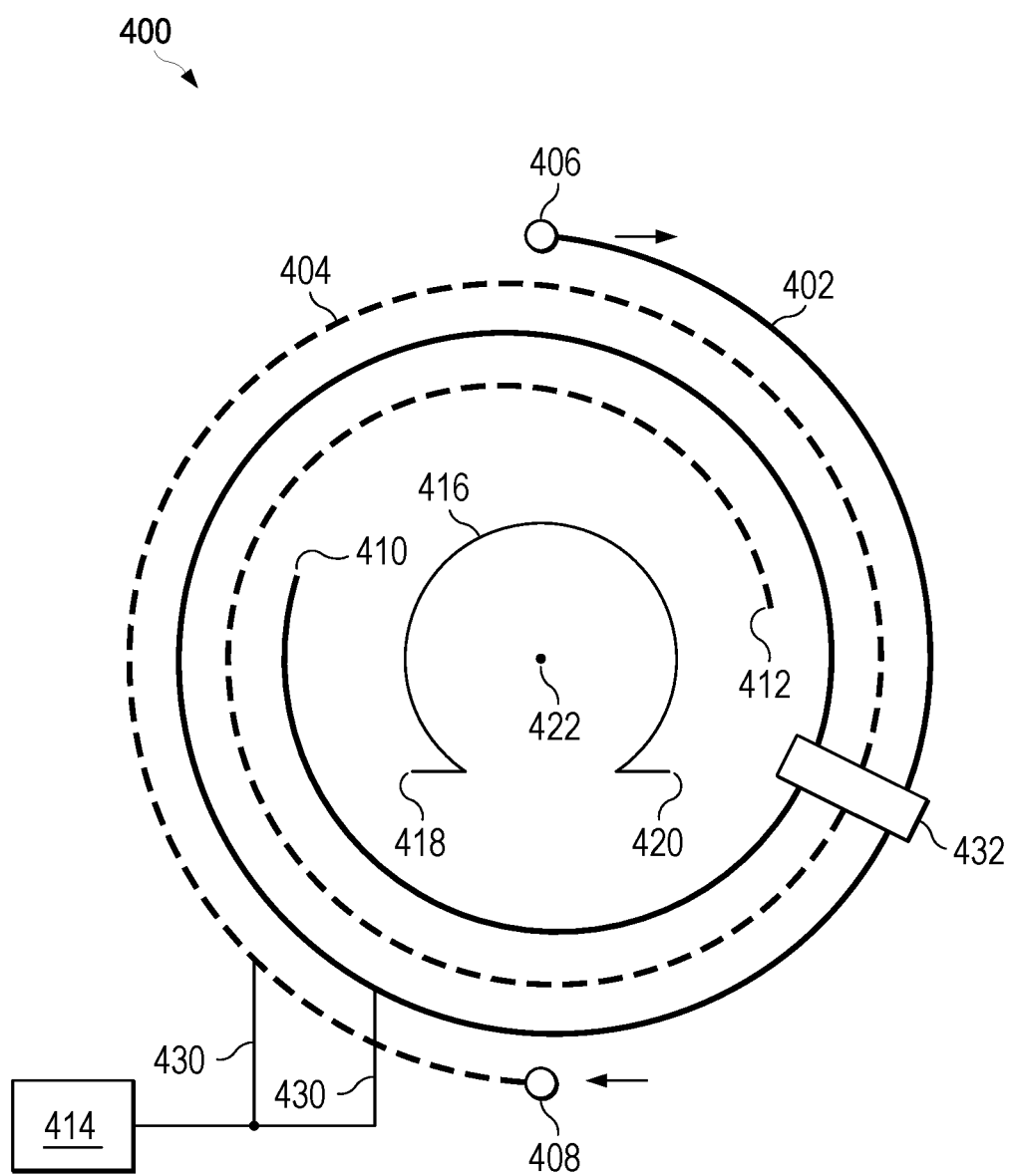
FIG. 4 is an embodiment resonating antenna.

FIG. 4 illustrates an embodiment resonating antenna 400, which may be arranged in the plasma processing system 100 for the radiating antenna 104. Resonating antenna 400 includes a pair of spiral resonant antennas, each configured as a quarter-wavelength resonator. The first one of the pair of spiral resonant antennas is the first coil 402 (also referred to as the inner coil). A second one of the pair of spiral resonant antennas is the second coil 404 (also referred to as the outer coil). The first coil 402 and the second coil 404 are shown to be substantially on the same plane and nested within each other. The nested arrangement effectively places each turn of the first coil 402 adjacent to a respective turn of the second coil 404. Each coil 402, 404 may have one or more turns to form the respective spiral resonant antenna. Thus, the number of turns for each coil 402, 404 is non-limiting. In embodiments, the current flow path in the resonating antenna 400 is from circuit 300 at the first end 408 to the second coil 404 and from the first coil 402 to circuit 300 at the first end 406.

In embodiments, the resonating antenna 400 is arranged on a plane parallel to the top cover 105 of the plasma chamber 106. In embodiments, the resonating antenna 400 is coupled to a mechanical structure 414 (e.g., an actuator) that allows the resonating antenna 400 to be vertically adjusted with respect to the top cover 105 while remaining parallel to the top cover 105. In embodiments, the matching circuit 103, the capacitors 304, 306, and balun 302 are configurable to provide an improved match based on a change at the load in response to the adjustment of the resonating antenna 400.

The first coil 402 and the second coil 404 are spiral conductive structures. In embodiments, the electrical lengths of the first coil 402 and the second coil 404 are substantially equal to a quarter resonant frequency wavelength (i.e., quarter-wave). In embodiments, the first coil 402 and the second coil 404 are arranged symmetrically with respect to a center point 422 defining the spiral structure of each coil. In embodiments, the first coil 402 and the second coil 404 are arranged as planar spiral conductive coils. In embodiments, the first coil 402 and the second coil 404 are intertwined on the same plane configured to radiate the electromagnetic wave.

The first terminal 308 of circuit 300 is couplable to the first end 406 of the first coil 402, where the first end 406 is at an outer portion of the first coil 402. The second terminal 310 of circuit 300 is couplable to the first end 408 of the second coil 404, where the first end 408 is at an outer portion of the second coil 404. In embodiments, the second end 410 of the first coil 402 and the second end 412 of the second coil 404 are floating (i.e., open circuit), where the second end 410 is at an inner portion (i.e., near the center point 422) of the first coil 402, and where the second end 412 is at an inner portion of the second coil 404. In embodiments, the second ends 410, 412 are couplable to a reference ground.

In embodiments, the first coil 402 and the second coil 404 are arranged in a nested configuration. In embodiments, the first coil 402 and the second coil 404 are arranged in an interwoven (i.e., braided) configuration but electrically isolated. In embodiments, the second coil 404 is arranged such that a radial distance from any point, along the length of the second coil 404, is equally separated (i.e., equidistance) from the first coil 402.

In embodiments, the first coil 402 and the second coil 404 are substantially on the same plane. In embodiments, the first coil 402 and the second coil 404 are on different planes that are substantially perpendicular to each other. In embodiments, the first coil 402 and the second coil 404 have a common center point 422 at the center of the spiral conductive structure. In embodiments, the first coil 402 and the second coil 404 are conical coils arranged such that the conical coils have a first common plane at the base and a second common plane at the top. In embodiments, the first coil 402 and the second coil 404 are cylindrical coils arranged such that the cylindrical coils have a first common plane at the base and a second common plane at the top.

In embodiments, the first ends 406 and 408 are substantially on a first plane and 180 degrees offset. In embodiments, the second ends 410 and 412 are substantially on a second plane and 180 degrees offset. In embodiments, the first end 406 is offset from the second end 410 in the first coil 402 such that the electrical length of the first coil 402 corresponds to a quarter resonant frequency wavelength. In embodiments, the first end 408 is offset from the second end 412 in the second coil 404 such that the electrical length of the second coil 404 corresponds to a quarter resonant frequency wavelength. In embodiments, the first and the second planes are the same planes. In embodiments, the first and second planes are offset from each with a distance that results in a quarter-wave electrical length for the first coil 402 and the second coil 404.

In embodiments, the first coil 402 and the second coil 404 have a design corresponding to an arc or a spiral, for example, an Archimedean, an equiangular, an Euler, a Cornu, a Clothoid, a Cotes, a Fermat, a parabolic, a lituus, a Poinsot, a reciprocal, a hyperbolic, a logarithmic, or a sinusoidal spiral forming a spiral antenna. However, the design of the resonating antenna 400 is non-limiting. As another example, the resonating antenna 400 can be a single-coil arc plate, a double-coil arc plate, or a unibody arc plate.

In embodiments, each of the first coil 402 and the second coil 404 are a solid conductive plate having cutouts to form the respective coils. In embodiments, a non-conductive structure (e.g., a non-conductive plate with cutouts to hold the first coil 402 and the second coil 404) provides structural support to arrange the first coil 402 within the inner radius of the second coil 404.

In embodiments, vertical non-conductive structures 430 (e.g., non-conductive offsets perpendicular to the first coil 402 and the second coil 404) are structurally coupled to the first coil 402 and the second coil 404. In embodiments, horizontal non-conductive structures 432 provide structural support to separate the first coil 402 from the second coil 404 at an equidistance along the spiral structures. In embodiments, the second ends 410, 412 of the first coil 402 and the second coil 404, respectively, are floating. The vertical non-conductive structures 430 and the horizontal non-conductive structures 432 may be arranged on any position along the length of the first coil 402, the second coil 404, or both. In embodiments, the vertical non-conductive structures 430 are configurable to vertically adjust the plane on which the resonating antenna 400 is arranged with respect (substantially parallel) to the top cover 105 of the plasma chamber 106. In embodiments, each of the first coil 402 and the second coil 404 includes a wire arranged in a spiral configuration. The first end of the wire of each of the first coil 402 and the second coil 404 is couplable to a respective terminal (i.e., terminals 308 and 310) of circuit 300.

Resonating antenna 400 is arranged as a dual spiral quarter-wavelength resonator, where first ends 406, 408 of each coil 402, 404 is couplable to the balun 302, and a second end 410, 412 of each coil 402, 404 is left as an open circuit. A quarter-wavelength resonator exhibits resonance at discrete frequencies corresponding to L (the physical length of each coil 402, 404) equal to a multiple of one-quarter of a wavelength (λ) or $$L = n \times \frac{\lambda}{4},$$

where n is a whole number. Here, the frequency corresponds to the frequency of the RF wave directed from the RF source 102 couplable to the resonating antenna 400. In embodiments, the physical length of the first coil 402 is substantially equal to the physical length of the second coil 404. In embodiments, the physical length of the first coil 402 is different from that of the second coil 404.

Resonating antenna 400, optionally, includes a third coil 416 nested within a central position in an inner portion of each of the first coil 402 and the second coil 404. The third coil 416 has a first end 418 and a second end 420 that is grounded. In embodiments, the third coil 416 is substantially on the same plane as the first coil 402, the second coil 404, or the first coil 402 and the second coil 404. In embodiments, the first coil 402, second coil 404, and the third coil 416 are symmetrically arranged, such that each coil shares the same center point 422.

Figure 5:
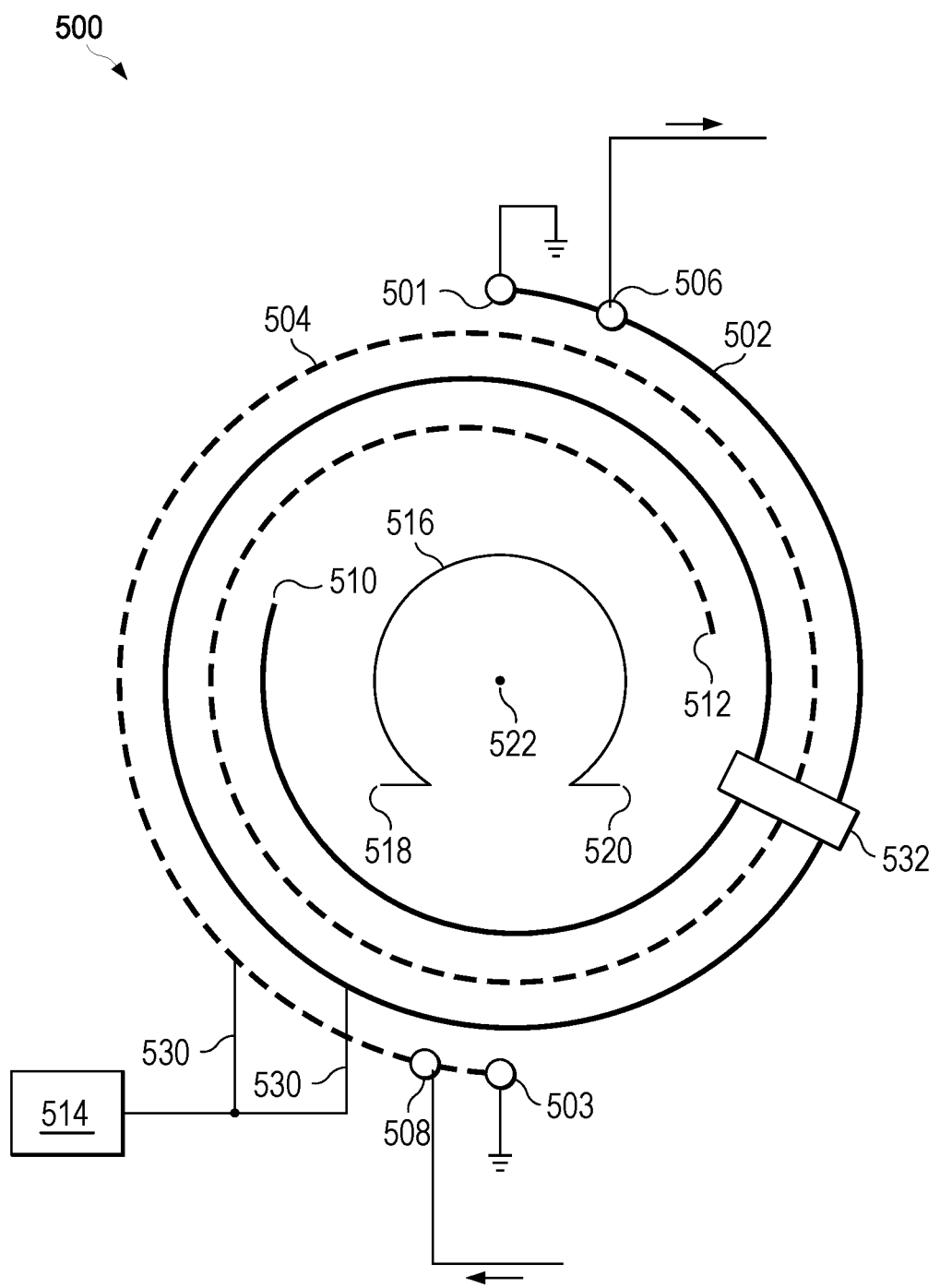
FIG. 5 is an embodiment resonating antenna.

FIG. 5 illustrates an embodiment resonating antenna 500, which may be arranged in the plasma processing system 100 for the radiating antenna 104. Resonating antenna 500 includes a pair of spiral resonant antennas, each configured as a quarter-wavelength resonator. The first one of the pair of spiral resonant antennas is the first coil 502 (also referred to as the inner coil). A second one of the pair of spiral resonant antennas is the second coil 504 (also referred to as the outer coil). The first coil 502 and the second coil 504 are shown to be substantially on the same plane and nested within each other. The nested arrangement effectively places each turn of the first coil 502 adjacent to a respective turn of the second coil 504. Each coil 502, 504 may have one or more turns to form the respective spiral resonant antenna. Thus, the number of turns for each coil 502, 504 is non-limiting. In embodiments, the current flow path in the resonating antenna 500 is from circuit 300 at terminal 508 to the second coil 504 and from the first coil 502 to circuit 300 at terminal 506.

In embodiments, the resonating antenna 500 is arranged on a plane parallel to the top cover 105 of the plasma chamber 106. In embodiments, the resonating antenna 500 is coupled to a mechanical structure 514 (e.g., an actuator) that allows the resonating antenna 500 to be vertically adjusted with respect to the top cover 105 while remaining parallel to the top cover 105. In embodiments, the matching circuit 103, the capacitors 304, 306, and balun 302 are configurable to provide an improved match based on a change at the load in response to the adjustment of the resonating antenna 500.

The first coil 502 and the second coil 504 are spiral conductive structures. In embodiments, the electrical lengths of the first coil 502 and the second coil 504 are substantially equal to a quarter resonant frequency wavelength (i.e., quarter-wave). In embodiments, the first coil 502 and the second coil 504 are arranged symmetrically with respect to a center point 522 defining the spiral structure of each coil. In embodiments, the first coil 502 and the second coil 504 are arranged as planar spiral conductive coils. In embodiments, the first coil 502 and the second coil 504 are intertwined on the same plane configured to radiate the electromagnetic wave.

A first end 501 of the first coil 502 and a first end 503 of the second coil 504 are couplable to a reference ground. The first terminal 308 of circuit 300 is couplable to terminal 506 of the first coil 502, where terminal 506 is at an outer portion of the first coil 502 and at a distance between 1 cm to 10 cm from the first end 501. The second terminal 310 of circuit 300 is couplable to terminal 508 of the second coil 504, where terminal 508 is at an outer portion of the second coil 504 and at a distance between 1 cm to 10 cm from the first end 503. In embodiments, the second end 510 of the first coil 502 and the second end 512 of the second coil 504 are floating (i.e., open circuit), where the second end 510 is at an inner portion (i.e., near the center point 522) of the first coil 502, and where the second end 512 is at an inner portion of the second coil 504. In embodiments, the second ends 510, 512 are couplable to a reference ground In embodiments, the first coil 502 and the second coil 504 are arranged in a nested configuration. In embodiments, the first coil 502 and the second coil 504 are arranged in an interwoven (i.e., braided) configuration but electrically isolated. In embodiments, the second coil 504 is arranged such that a radial distance from any point, along the length of the second coil 504, is equally separated (i.e., equidistance) from the first coil 502.

In embodiments, the first coil 502 and the second coil 504 are substantially on the same plane. In embodiments, the first coil 502 and the second coil 504 are on different planes that are substantially perpendicular to each other. In embodiments, the first coil 502 and the second coil 504 have a common center point 522 at the center of the spiral conductive structure. In embodiments, the first coil 502 and the second coil 504 are conical coils arranged such that the conical coils have a first common plane at the base and a second common plane at the top. In embodiments, the first coil 502 and the second coil 504 are cylindrical coils arranged such that the cylindrical coils have a first common plane at the base and a second common plane at the top.

In embodiments, the first ends 501 and 503 are substantially on a first plane and 180 degrees offset. In embodiments, the second ends 510 and 512 are substantially on a second plane and 180 degrees offset. In embodiments, the first end 501 is offset from the second end 510 in the first coil 502 such that the electrical length of the first coil 502 corresponds to a quarter resonant frequency wavelength. In embodiments, the first end 503 is offset from the second end 512 in the second coil 504 such that the electrical length of the second coil 504 corresponds to a quarter resonant frequency wavelength. In embodiments, the differential current mode is achieved when the first coil 502 and the second coil 504 are physically connected to RF power input at 506 and 508, respectively through the current balun (e.g., FIG. 9B). In embodiments, the first and the second planes are the same planes.

In embodiments, the first coil 502 and the second coil 504 have a design corresponding to an arc or a spiral, for example, an Archimedean, an equiangular, an Euler, a Cornu, a Clothoid, a Cotes, a Fermat, a parabolic, a lituus, a Poinsot, a reciprocal, a hyperbolic, a logarithmic, or a sinusoidal spiral forming a spiral antenna. However, the design of the resonating antenna 500 is non-limiting. As another example, the resonating antennas can be a single-coil arc plate, a double-coil arc plate, or a unibody arc plate.

In embodiments, each of the first coil 502 and the second coil 504 are a solid conductive plate having cutouts to form the respective coils. In embodiments, a non-conductive structure (e.g., a non-conductive plate with cutouts to hold the first coil 502 and the second coil 504) provides structural support to arrange the first coil 502 within the inner radius of the second coil 504.

In embodiments, vertical non-conductive structures 530 (e.g., non-conductive offsets perpendicular to the first coil 502 and the second coil 504) are structurally coupled to the first coil 502 and the second coil 504. In embodiments, horizontal non-conductive structures 532 provide structural support to separate the first coil 502 from the second coil 504 at an equidistance along the spiral structures. In embodiments, the second ends 510, 512 of the first coil 502 and the second coil 504, respectively, are floating. The vertical non-conductive structures 530 and the horizontal non-conductive structures 532 may be arranged on any position along the length of the first coil 502, the second coil 504, or both. In embodiments, the vertical non-conductive structures 530 are configurable to vertically adjust the plane on which the resonating antenna 500 is arranged with respect (substantially parallel) to the top cover 105 of the plasma chamber 106. In embodiments, each of the first coil 502 and the second coil 504 includes a wire arranged in a spiral configuration. The terminals 506, 508 of each of the first coil 502 and the second coil 504, respectively, are couplable to a respective terminal (i.e., terminals 308 and 310) of circuit 300.

Resonating antenna 500 is arranged as a dual spiral quarter-wavelength resonator, where terminals 506, 508 of each coil 502, 504 is couplable to the balun 302, and a second end 510, 512 of each coil 502, 504 is left as an open circuit. A quarter-wavelength resonator exhibits resonance at discrete frequencies corresponding to L (the physical length of each coil 502, 504) equal to a multiple of one-quarter of a wavelength (λ) or $$L = n \times \frac{\lambda}{4},$$

where n is a whole number. Here, the frequency corresponds to the frequency of the RF wave directed from the RF source 102 couplable to the resonating antenna 500. In embodiments, the physical length of the first coil 502 is substantially equal to the physical length of the second coil 504. In embodiments, the physical length of the first coil 502 is different from the physical length of the second coil 504.

Resonating antenna 500, optionally, includes a third coil 516 nested within a central position in an inner portion of each of the first coil 502 and the second coil 504. The third coil 516 has a first end 518 and a second end 520 that is grounded. In embodiments, the third coil 516 is substantially on the same plane as the first coil 502, the second coil 504, or the first coil 502 and the second coil 504. In embodiments, the first coil 502, second coil 504, and the third coil 516 are symmetrically arranged, such that each coil shares the same center point 522.

Figure 6:
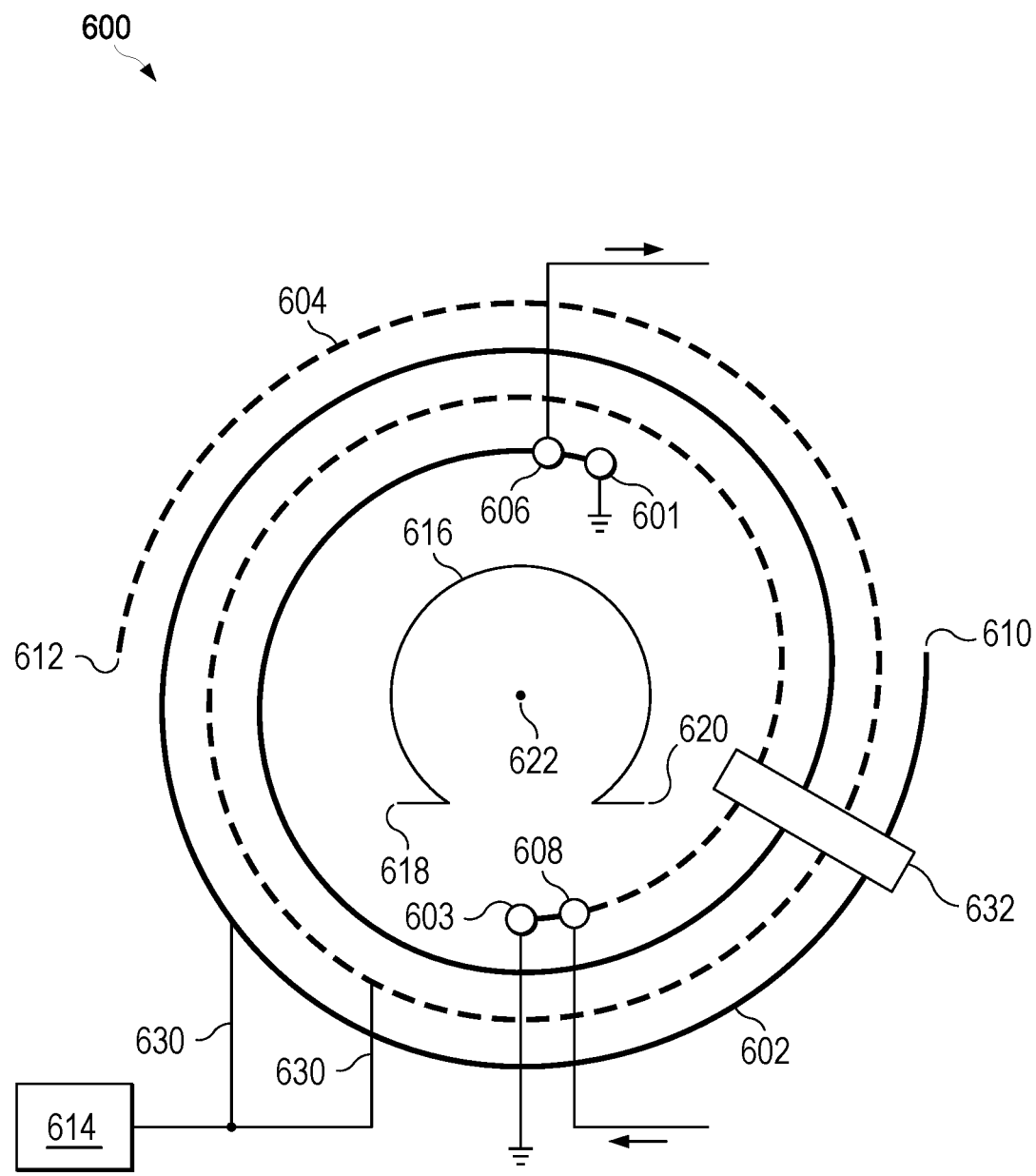
FIG. 6 is an embodiment resonating antenna.

FIG. 6 illustrates an embodiment resonating antenna 600, which may be arranged in the plasma processing system 100 for the radiating antenna 104. Resonating antenna 600 includes a pair of spiral resonant antennas, each configured as a quarter-wavelength resonator. The first one of the pair of spiral resonant antennas is the first coil 602 (also referred to as the inner coil). A second one of the pair of spiral resonant antennas is the second coil 604 (also referred to as the outer coil). The first coil 602 and the second coil 604 are shown to be substantially on the same plane and nested within each other. The nested arrangement effectively places each turn of the first coil 602 adjacent to a respective turn of the second coil 604. Each coil 602, 604 may have one or more turns to form the respective spiral resonant antenna. Thus, the number of turns for each coil 602, 604 is non-limiting. In embodiments, the current flow path in the resonating antenna 600 is from circuit 300 at terminal 608 to the second coil 604 and from the first coil 602 to circuit 300 at terminal 606.

In embodiments, the resonating antenna 600 is arranged on a plane parallel to the top cover 105 of the plasma chamber 106. In embodiments, the resonating antenna 600 is coupled to a mechanical structure 614 (e.g., an actuator) that allows the resonating antenna 600 to be vertically adjusted with respect to the top cover 105 while remaining parallel to the top cover 105. In embodiments, the matching circuit 103, the capacitors 304, 306, and balun 302 are configurable to provide an improved match based on a change at the load in response to the adjustment of the resonating antenna 600.

The first coil 602 and the second coil 604 are spiral conductive structures. In embodiments, the electrical lengths of the first coil 602 and the second coil 604 are substantially equal to a quarter resonant frequency wavelength (i.e., quarter-wave). In embodiments, the first coil 602 and the second coil 604 are arranged symmetrically with respect to a center point 622 defining the spiral structure of each coil. In embodiments, the first coil 602 and the second coil 604 are arranged as planar spiral conductive coils. In embodiments, the first coil 602 and the second coil 604 are intertwined on the same plane configured to radiate the electromagnetic wave.

A first end 601 of the first coil 602 and a first end 603 of the second coil 604 are couplable to a reference ground. The first terminal 308 of circuit 300 is couplable to terminal 606 of the first coil 602, where terminal 606 is at an inner portion of the first coil 602 and at a distance between 1 cm to 10 cm from the first end 601. The second terminal 310 of circuit 300 is couplable to terminal 608 of the second coil 604, where terminal 608 is at an inner portion of the second coil 604 and at a distance between 1 cm to 10 cm from the first end 603. In embodiments, the second end 610 of the first coil 602 and the second end 612 of the second coil 604 are floating (i.e., open circuit), where the second end 610 is at an outer portion of the first coil 602, and where the second end 612 is at an outer portion of the second coil 604. In embodiments, the second ends 610, 612 are couplable to a reference ground.

In embodiments, the first coil 602 and the second coil 604 are arranged in a nested configuration. In embodiments, the first coil 602 and the second coil 604 are arranged in an interwoven (i.e., braided) configuration but electrically isolated. In embodiments, the second coil 604 is arranged such that a radial distance from any point, along the length of the second coil 604, is equally separated (i.e., equidistance) from the first coil 602.

In embodiments, the first coil 602 and the second coil 604 are substantially on the same plane. In embodiments, the first coil 602 and the second coil 604 are on different planes that are substantially perpendicular to each other. In embodiments, the first coil 602 and the second coil 604 have a common center point 622 at the center of the spiral conductive structure. In embodiments, the first coil 602 and the second coil 604 are conical coils arranged such that the conical coils have a first common plane at the base and a second common plane at the top. In embodiments, the first coil 602 and the second coil 604 are cylindrical coils arranged such that the cylindrical coils have a first common plane at the base and a second common plane at the top.

In embodiments, the first ends 601 and 603 are substantially on a first plane and 180 degrees offset. In embodiments, the second ends 610 and 612 are substantially on a second plane and 180 degrees offset. In embodiments, the first end 601 is offset from the second end 610 in the first coil 602 such that the electrical length of the first coil 602 corresponds to a quarter resonant frequency wavelength. In embodiments, the first end 603 is offset from the second end 612 in the second coil 604 such that the electrical length of the second coil 604 corresponds to a quarter resonant frequency wavelength. In embodiments, the differential current mode is achieved when the first coil 602 and the second coil 604 are physically connected to RF power at 606 and 608, respectively, through the current balun (e.g., FIG. 9B). In embodiments, the first and the second planes are the same planes.

In embodiments, the first coil 602 and the second coil 604 have a design corresponding to an arc or a spiral, for example, an Archimedean, an equiangular, an Euler, a Cornu, a Clothoid, a Cotes, a Fermat, a parabolic, a lituus, a Poinsot, a reciprocal, a hyperbolic, a logarithmic, or a sinusoidal spiral forming a spiral antenna. However, the design of the resonating antenna 600 is non-limiting. As another example, the resonating antenna 600 can be a single-coil arc plate, a double-coil arc plate, or a unibody arc plate.

In embodiments, each of the first coil 602 and the second coil 604 are a solid conductive plate having cutouts to form the respective coils. In embodiments, a non-conductive structure (e.g., a non-conductive plate with cutouts to hold the first coil 602 and the second coil 604) provides structural support to arrange the first coil 602 within the inner radius of the second coil 604.

In embodiments, vertical non-conductive structures 630 (e.g., non-conductive offsets perpendicular to the first coil 602 and the second coil 604) are structurally coupled to the first coil 602 and the second coil 604. In embodiments, horizontal non-conductive structures 632 provide structural support to separate the first coil 602 from the second coil 604 at an equidistance along the spiral structures. In embodiments, the second ends 610, 612 of the first coil 602 and the second coil 604, respectively, are floating. The vertical non-conductive structures 630 and the horizontal non-conductive structures 632 may be arranged on any position along the length of the first coil 602, the second coil 604, or both. In embodiments, the vertical non-conductive structures 630 are configurable to vertically adjust the plane on which the resonating antenna 600 is arranged with respect (substantially parallel) to the top cover 105 of the plasma chamber 106. In embodiments, each of the first coil 602 and the second coil 604 includes a wire arranged in a spiral configuration. The first end of the wire of each of the first coil 602 and the second coil 604 is couplable to a respective terminal (i.e., terminals 308 and 310) of circuit 300.

Resonating antenna 600 is arranged as a dual spiral quarter-wavelength resonator, where terminals 606, 608 of each coil 602, 604 are couplable to the balun 302, and a second end 610, 612 of each coil 602, 604 is left as an open circuit. A quarter-wavelength resonator exhibits resonance at discrete frequencies corresponding to L (the physical length of each coil 602, 604) equal to a multiple of one-quarter of a wavelength (λ) or $$L = n \times \frac{\lambda}{4},$$

where n is a whole number. Here, the frequency corresponds to the frequency of the RF wave directed from the RF source 102 couplable to the resonating antenna 600. In embodiments, the physical length of the first coil 602 is substantially equal to that of the second coil 604. In embodiments, the physical length of the first coil 602 differs from that of the second coil 604.

Resonating antenna 600, optionally, includes a third coil 616 nested within a central position in an inner portion of each of the first coil 602 and the second coil 604. The third coil 616 has a first end 618 and a second end 620 that is grounded. In embodiments, the third coil 616 is substantially on the same plane as the first coil 602, the second coil 604, or the first coil 602 and the second coil 604. In embodiments, the first coil 602, second coil 604, and the third coil 616 are symmetrically arranged, such that each coil shares the same center point 622.

Figure 7:
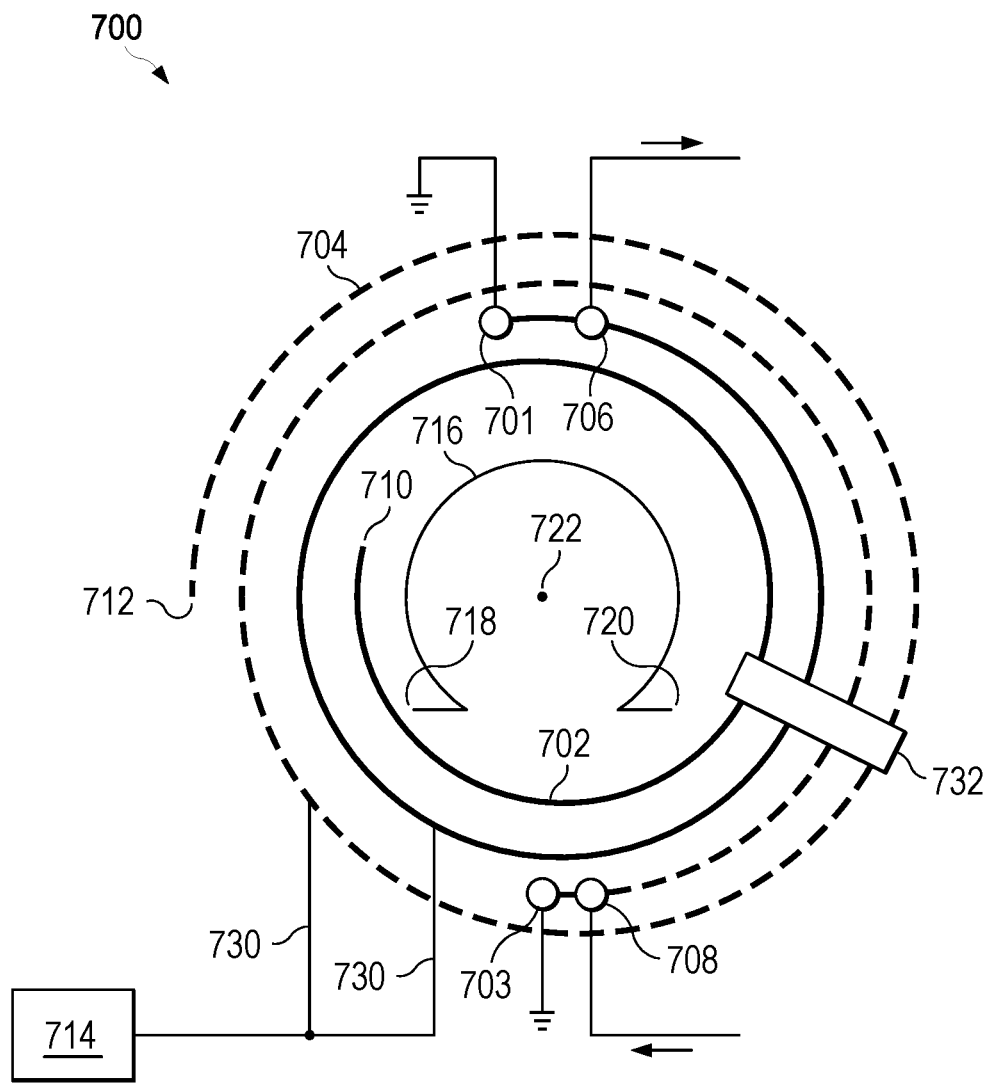
FIG. 7 is an embodiment resonating antenna.

FIG. 7 illustrates an embodiment resonating antenna 700, which may be arranged in the plasma processing system 100 for the radiating antenna 104. Resonating antenna 700 includes a pair of spiral resonant antennas, each configured as a quarter-wavelength resonator. The first one of the pair of spiral resonant antennas is the first coil 702 (also referred to as the inner coil). A second one of the pair of spiral resonant antennas is the second coil 704 (also referred to as the outer coil). The first coil 702 and the second coil 704 are shown to be substantially on the same plane. The first coil 702 is nested in a central position within an inner portion of the second coil 704. Each coil 702, 704 may have one or more turns to form the respective spiral resonant antenna. Thus, the number of turns for each coil 702, 704 is non-limiting. In embodiments, the current flow path in the resonating antenna 700 is from circuit 300 at terminal 708 to the second coil 704 and from the first coil 702 to circuit 300 at terminal 706.

In embodiments, the resonating antenna 700 is arranged on a plane parallel to the top cover 105 of the plasma chamber 106. In embodiments, the resonating antenna 700 is coupled to a mechanical structure 714 (e.g., an actuator) that allows the resonating antenna 700 to be vertically adjusted with respect to the top cover 105 while remaining parallel to the top cover 105. In embodiments, the matching circuit 103, the capacitors 304, 306, and balun 302 are configurable to provide an improved match based on a change at the load in response to the adjustment of the resonating antenna 700.

The first coil 702 and the second coil 704 are spiral conductive structures. In embodiments, the electrical lengths of the first coil 702 and the second coil 704 are substantially equal to a quarter resonant frequency wavelength (i.e., quarter-wave). In embodiments, the first coil 702 and the second coil 704 are arranged symmetrically with respect to a center point 722 defining the spiral structure of each coil. In embodiments, the first coil 702 and the second coil 704 are arranged as planar spiral conductive coils. In embodiments, the first coil 702 and the second coil 704 are on the same plane configured to radiate the electromagnetic wave.

A first end 701 of the first coil 702 and a first end 703 of the second coil 704 are couplable to a reference ground. The first terminal 308 of circuit 300 is couplable to terminal 706 of the first coil 702, where terminal 706 is at an inner portion of the first coil 702 and at a distance between 1 cm to 10 cm from the first end 701. The second terminal 310 of circuit 300 is couplable to terminal 708 of the second coil 704, where terminal 708 is at an inner portion of the second coil 704 and at a distance between 1 cm to 10 cm from the first end 703. In embodiments, the second end 710 of the first coil 702 and the second end 712 of the second coil 704 are floating (i.e., open circuit), where the second end 710 is at an outer portion of the first coil 702, and where the second end 712 is at an outer portion of the second coil 704. In embodiments, the second ends 710, 712 are couplable to a reference ground.

In embodiments, the first coil 702 and the second coil 704 are arranged in a nested configuration such that the first coil 702 is symmetrically nested within an inner portion of the second coil 704. In embodiments, the first coil 702 and the second coil 704 are electrically isolated. In embodiments, the second coil 704 is arranged such that a radial distance from any point, along the length of the second coil 704, is equally separated (i.e., equidistance) from the first coil 702.

In embodiments, the first coil 702 and the second coil 704 are substantially on the same plane. In embodiments, the first coil 702 and the second coil 704 are on different planes that are substantially perpendicular to each other. In embodiments, the first coil 702 and the second coil 704 have a common center point 722 at the center of the spiral conductive structure. In embodiments, the first coil 702 and the second coil 704 are conical coils arranged such that the conical coils have a first common plane at the base and a second common plane at the top. In embodiments, the first coil 702 and the second coil 704 are cylindrical coils arranged such that the cylindrical coils have a first common plane at the base and a second common plane at the top.

In embodiments, the first ends 701 and 703 are substantially on a first plane and 180 degrees offset. In embodiments, the second ends 710 and 712 are substantially on a second plane and 180 degrees offset. In embodiments, the first end 701 is offset from the second end 710 in the first coil 702 such that the electrical length of the first coil 702 corresponds to a quarter resonant frequency wavelength. In embodiments, the first end 703 is offset from the second end 712 in the second coil 704 such that the electrical length of the second coil 704 corresponds to a quarter resonant frequency wavelength. In embodiments, the differential current mode is achieved when the first coil 702 and the second coil 704 are physically connected to RF power input at 706 and 708, respectively, through the current balun (e.g., FIG. 9B). In embodiments, the first and the second planes are the same planes.

In embodiments, the first coil 702 and the second coil 704 have a design corresponding to an arc or a spiral, for example, an Archimedean spiral forming a spiral antenna. However, the design of the resonating antenna 700 is non-limiting. For example, in embodiments, the first coil 702 and the second coil 704 can be in the shape of logarithmic spirals forming a spiral antenna. As another example, the resonating antenna 700 can be a single-coil arc plate, a double-coil arc plate, or a unibody arc plate.

In embodiments, each of the first coil 702 and the second coil 704 are a solid conductive plate having cutouts to form the respective coils. In embodiments, a non-conductive structure (e.g., a non-conductive plate with cutouts to hold the first coil 702 and the second coil 704) provides structural support to arrange the first coil 702 within the inner radius of the second coil 704.

In embodiments, vertical non-conductive structures 730 (e.g., non-conductive offsets perpendicular to the first coil 702 and the second coil 704) are structurally coupled to the first coil 702 and the second coil 704. In embodiments, horizontal non-conductive structures 732 provide structural support to separate the first coil 702 from the second coil 704 along the spiral structures. In embodiments, the second ends 710, 712 of the first coil 702 and the second coil 704, respectively, are floating. The vertical non-conductive structures 730 and the horizontal non-conductive structures 732 may be arranged on any position along the length of the first coil 702, the second coil 704, or both. In embodiments, the vertical non-conductive structures 730 are configurable to vertically adjust the plane on which the resonating antenna 700 is arranged with respect (substantially parallel) to the top cover 105 of the plasma chamber 106. In embodiments, the first coil 702 and the second coil 704 include a wire arranged in a spiral configuration. The first end of the wire of each of the first coil 702 and the second coil 704 is couplable to a respective terminal (i.e., terminals 308 and 310) of circuit 300.

Resonating antenna 700 is arranged as a dual spiral quarter-wavelength resonator, where terminals 706, 708 of each coil 702, 704 are couplable to the balun 302, and a second end 710, 712 of each coil 702, 704 is left as an open circuit. A quarter-wavelength resonator exhibits resonance at discrete frequencies corresponding to L (the physical length of each coil 702, 704) equal to a multiple of one-quarter of a wavelength (λ) or $$L = n \times \frac{\lambda}{4},$$

where n is a whole number. Here, the frequency corresponds to the frequency of the RF wave directed from the RF source 102 couplable to the resonating antenna 700. In embodiments, the physical length of the first coil 702 is substantially equal to the physical length of the second coil 704. In embodiments, the physical length of the first coil 702 is different from that of the second coil 704.

Resonating antenna 700, optionally, includes a third coil 716 nested within a central position in an inner portion of each of the first coil 702 and the second coil 704. The third coil 716 has a first end 718 and a second end 720 that is grounded. In embodiments, the third coil 716 is substantially on the same plane as the first coil 702, the second coil 704, or the first coil 702 and the second coil 704. In embodiments, the first coil 702, second coil 704, and the third coil 716 are symmetrically arranged, such that each coil shares the same center point 722.

Figure 8A:
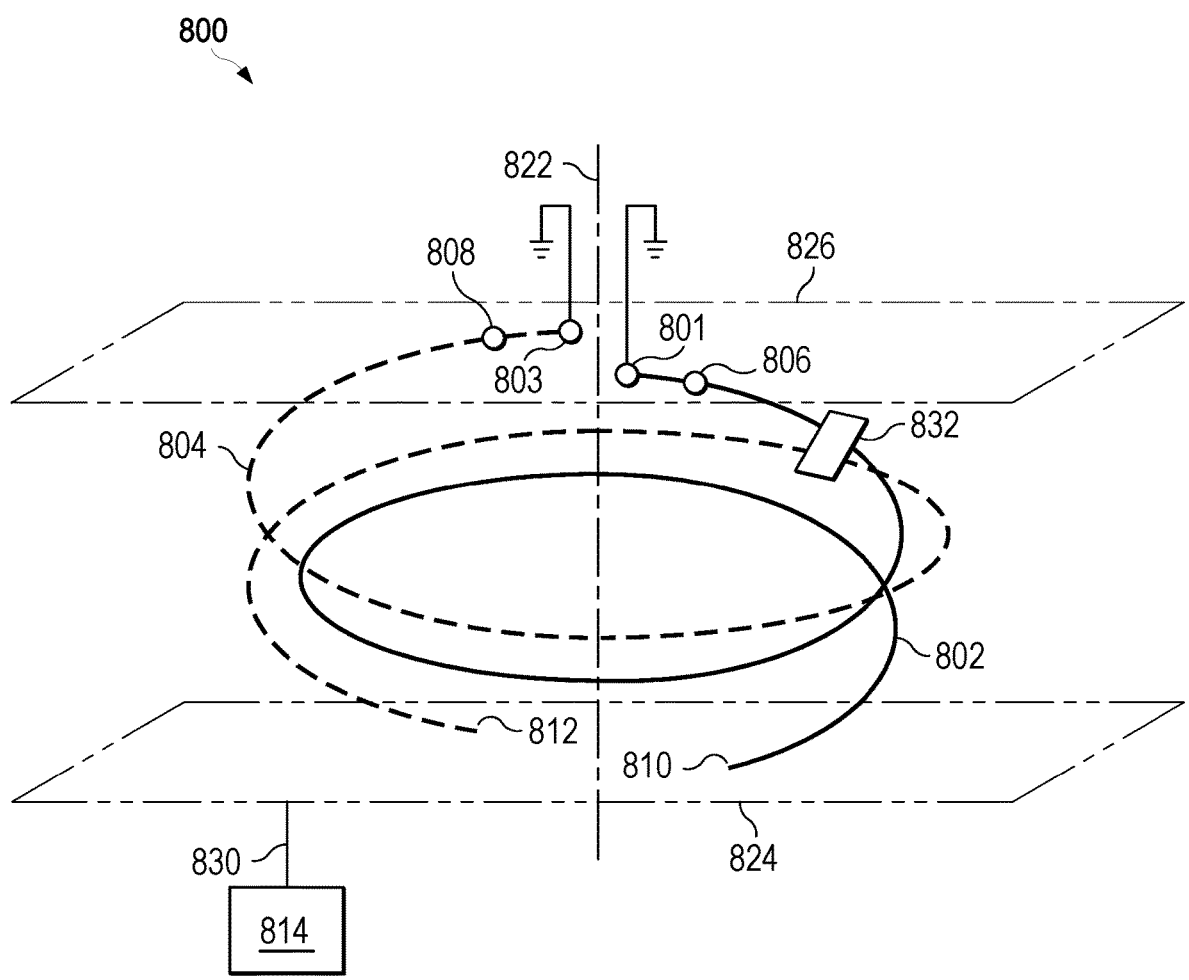
FIG. 8A is an embodiment resonating antenna.

FIG. 8A illustrates an embodiment resonating antenna 800, which may be arranged in the plasma processing system 100 for the radiating antenna 104. Resonating antenna 800 includes a pair of conical spiral resonant antennas, each configured as a quarter-wavelength resonator. The first one of the pair of conical spiral resonant antennas is the first coil 802 (also referred to as the inner coil). A second one of the pair of conical spiral resonant antennas is the second coil 804 (also referred to as the outer coil). The first coil 802 and the second coil 804 are nested within each other. The nested arrangement effectively places each turn of the first coil 802 adjacent to a respective turn of the second coil 804. Each coil 802, 804 may have one or more turns to form the respective spiral resonant antenna. Thus, the number of turns for each coil 802, 804 is non-limiting.

In embodiments, the current flow path in the resonating antenna 800 is from circuit 300 at terminal 806 to the first coil 802 and from the second coil 804 to circuit 300 at terminal 808. In embodiments, the current flow path in the resonating antenna 800 is from circuit 300 at terminal 808 to the second coil 804 and from the first coil 802 to circuit 300 at terminal 806.

In embodiments, the second ends 810, 812 are on a first plane 824 that is substantially parallel and nearest (with respect to the resonating antenna 800) to the top cover 105 of the plasma chamber 106. In embodiments, the resonating antenna 800 is coupled to a mechanical structure 814 (e.g., an actuator) that allows the resonating antenna 800 to be vertically adjusted with respect to the top cover 105 while the first plane 824 remains parallel to the top cover 105. In embodiments, the matching circuit 103, the capacitors 304, 306, and balun 302 are configurable to provide an improved match based on a change at the load in response to the adjustment of the resonating antenna 800.

The first coil 802 and the second coil 804 are spiral conductive structures. In embodiments, the electrical lengths of the first coil 802 and the second coil 804 are substantially equal to a quarter resonant frequency wavelength (i.e., quarter-wave). In embodiments, the first coil 802 and the second coil 804 are arranged symmetrically with respect to a center line 822, perpendicular to the first plane 824.

A first end 801 of the first coil 802 and a first end 803 of the second coil 804 are couplable to a reference ground. The first terminal 308 of circuit 300 is couplable to terminal 806 of the first coil 802, where terminal 806 is at a vertical position further away from first plane 824 than the second end 810 in the first coil 802. The second terminal 310 of circuit 300 is couplable to terminal 808 of the second coil 804, where terminal 808 is at a vertical position further away from the first plane 824 than the second end 812 in the second coil. In embodiments, the second end 810 of the first coil 802 and the second end 812 of the second coil 804 are floating (i.e., open circuit), where the second end 810 is vertically nearest to the first plane 824 with respect to terminal 806 in the first coil 802, and where the second end 812 is vertically nearest to the first plane 824 with respect to terminal 808 in the second coil 804. In embodiments, the second ends 810, 812 are couplable to a reference ground.

In embodiments, the first coil 802 and the second coil 804 are arranged in a nested configuration. In embodiments, the first coil 802 and the second coil 804 are electrically isolated. In embodiments, the second coil 804 is arranged such that a radial distance from any point, along the length of the second coil 804, is equally separated (i.e., equidistance) from the first coil 802.

In embodiments, the terminals 806, 808 are on a second plane 826 that is substantially parallel and furthest (with respect to the first plane 824) to the top cover 105 of the plasma chamber 106. In embodiments, the first coil 802 and the second coil 804 are conical coils (i.e., the bottom radius of coils 802, 804 on first plane 824 is different from the top radius of coils 802, 804 on plane 826. In embodiments, the coils 802, 804 are arranged such that the conical coils have a first common plane (i.e., first plane 824) at the base and a second common plane (i.e., second plane 826) at the top. In embodiments, the first coil 802 and the second coil 804 are cylindrical coils arranged such that the cylindrical coils have a first common plane at the base (i.e., first plane 824) and a second common plane (i.e., second plane 826) at the top.

In embodiments, the first ends 801 and 803 are substantially on a second plane 826 and 180 degrees offset. In embodiments, the second ends 810 and 812 are substantially on a first plane 824 and 180 degrees offset. In embodiments, the first end 801 is offset from the second end 810 in the first coil 802 such that the electrical length of the first coil 802 corresponds to a quarter resonant frequency wavelength. In embodiments, the first end 803 is offset from the second end 812 in the second coil 804 such that the electrical length of the second coil 804 corresponds to a quarter resonant frequency wavelength. In embodiments, the differential current mode is achieved when the first coil 802 and the second coil 804 are physically connected to RF power input at 806 and 808, respectively, through the current balun (e.g., FIG. 9B). In embodiments, the planes 824, 826 are offset from each with a distance that results in a quarter-wave electrical length for the first coil 802 and the second coil 804.

In embodiments, the first coil 802 and the second coil 804 have a design corresponding to a conical arc or a conical spiral, for example, an Archimedean conical spiral forming a conical spiral antenna. However, the design of the resonating antenna 800 is non-limiting. For example, in embodiments, the first coil 802 and the second coil 804 can be in the shape of conical logarithmic spirals forming a conical spiral antenna. As another example, the resonating antenna 800 can be a conical single-coil arc plate, a conical double-coil arc plate, or a conical unibody arc plate.

In embodiments, a non-conductive structure (e.g., a non-conductive plate with cutouts to hold the first coil 802 and the second coil 804) provides structural support to arrange the first coil 802 within the inner radius of the second coil 804.

In embodiments, vertical non-conductive structures 830 (e.g., non-conductive offsets perpendicular to the first plane 824 and the second plane 826) are structurally coupled to the first coil 802 and the second coil 804. In embodiments, horizontal non-conductive structures 832 provide structural support to separate the first coil 802 from the second coil 804 at an equidistance along the spiral structures. In embodiments, the second ends 810, 812 of the first coil 802 and the second coil 804, respectively, are floating. The vertical non-conductive structures 830 and the horizontal non-conductive structures 832 may be arranged on any position along the length of the first coil 802, the second coil 804, or both. In embodiments, the vertical non-conductive structures 830 are configurable to vertically adjust the first plane 824 on which the resonating antenna 800 is arranged with respect (substantially parallel) to the top cover 105 of the plasma chamber 106. In embodiments, the first coil 802 and the second coil 804 include a wire arranged in a spiral configuration. The first end of the wire of each of the first coil 802 and the second coil 804 is couplable to a respective terminal (i.e., terminals 308 and 310) of circuit 300.

Resonating antenna 800 is arranged as a conical dual spiral quarter-wavelength resonator, where terminals 806, 808 of each coil 802, 804 are couplable to the balun 302, and a second end 810, 812 of each coil 802, 804 is left as an open circuit. A quarter-wavelength resonator exhibits resonance at discrete frequencies corresponding to L (the physical length of each coil 802, 804) equal to a multiple of one-quarter of a wavelength (λ) or $$L = n \times \frac{\lambda}{4},$$

where n is a whole number. Here, the frequency corresponds to the frequency of the RF wave directed from the RF source 102 couplable to the resonating antenna 800. In embodiments, the physical length of the first coil 802 is substantially equal to the physical length of the second coil 804. In embodiments, the physical length of the first coil 802 is different from that of the second coil 804.

Figure 8B:
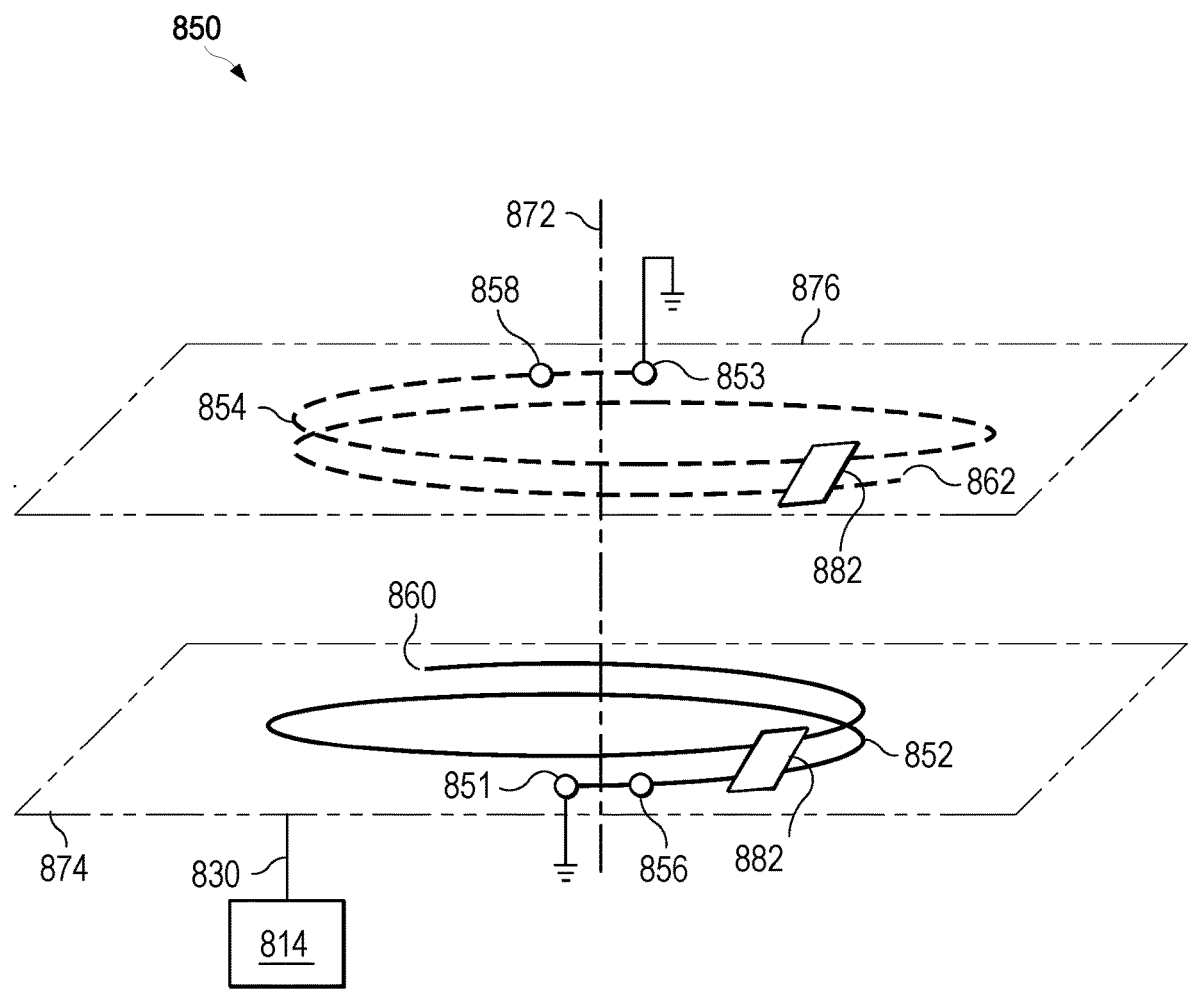
FIG. 8B is an embodiment resonating antenna.

FIG. 8B illustrates an embodiment resonating antenna 850, which may be arranged in the plasma processing system 100 for the radiating antenna 104. Resonating antenna 850 includes a pair of conical spiral resonant antennas, each configured as a quarter-wavelength resonator. The first one of the pair of conical spiral resonant antennas is the first coil 852. A second one of the pair of conical spiral resonant antennas is the second coil 854. The first coil 852 and the second coil 854 are arranged on a respective plane parallel to the other, but with a vertical offset in the vertical direction with respect to the plasma chamber 106. Each coil 852, 854 may have one or more turns to form the respective spiral resonant antenna. Thus, the number of turns for each coil 852, 854 is non-limiting.

In embodiments, the current flow path in the resonating antenna 850 is from circuit 300 at terminal 856 to the first coil 852 and from the second coil 854 to circuit 300 at terminal 858. In embodiments, the current flow path in the resonating antenna 850 is from circuit 300 at terminal 858 to the second coil 854 and from the first coil 852 to circuit 300 at terminal 856.

In embodiments, the first end 851 and the second end 860 are on a first plane 874 that is substantially parallel and nearest (with respect to the resonating antenna 850) to the top cover 105 of the plasma chamber 106. In embodiments, the matching circuit 103, the capacitors 304, 306, and balun 302 are configurable to provide an improved match based on a change at the load in response to the adjustment of the resonating antenna 850.

In embodiments, the first end 853 and the second end 862 are on a second plane 876 that is substantially parallel and furthest (with respect to the resonating antenna 850 and first plane 874) to the top cover 105 of the plasma chamber 106. In embodiments, the resonating antenna 850 is coupled to a mechanical structure 864 (e.g., an actuator) that allows the resonating antenna 850 to be vertically adjusted with respect to the top cover 105 while the first plane 874 and second plane 876 remain parallel to the top cover 105. In embodiments, the matching circuit 103, the capacitors 304, 306, and balun 302 are configurable to provide an improved match based on a change at the load in response to the adjustment of the resonating antenna 850.

The first coil 852 and the second coil 854 are spiral conductive structures. In embodiments, the electrical lengths of the first coil 852 and the second coil 854 are substantially equal to a quarter resonant frequency wavelength (i.e., quarter-wave). In embodiments, the first coil 852 and the second coil 854 are arranged symmetrically with respect to a center line 872, perpendicular to the first plane 874.

A first end 851 of the first coil 852 and a first end 853 of the second coil 854 are couplable to a reference ground. The first terminal 308 of circuit 300 is couplable to terminal 856 of the first coil 852, where terminal 856 is on the first plane 874. The second terminal 310 of circuit 300 is couplable to terminal 858 of the second coil 854, where terminal 858 is on the second plane 876. In embodiments, the second end 860 of the first coil 852 and the second end 862 of the second coil 854 are floating (i.e., open circuit). In embodiments, the second ends 860, 862 are couplable to a reference ground.

In embodiments, the first coil 852 and the second coil 854 are arranged in a nested configuration. In embodiments, the first coil 852 and the second coil 854 are electrically isolated. In embodiments, the second coil 854 is arranged such that a radial distance from any point along the length of the second coil 854, is equally separated (i.e., equidistance) from the first coil 852.

In embodiments, the first ends 851, 853 are substantially 180 degrees offset. In embodiments, the second ends 860 and 862 are substantially 180 degrees offset. In embodiments, the first end 851 is offset from the second end 860 in the first coil 852 such that the electrical length of the first coil 852 corresponds to a quarter resonant frequency wavelength. In embodiments, the first end 853 is offset from the second end 862 in the second coil 854 such that the electrical length of the second coil 854 corresponds to a quarter resonant frequency wavelength. In embodiments, the differential current mode is achieved when the first coil 852 and the second coil 854 are physically connected to RF power input at 856 and 858, respectively, through the current balun (e.g., FIG. 9B).

In embodiments, the first coil 852 and the second coil 854 have a design corresponding to an arc or a spiral, for example, an Archimedean, an equiangular, an Euler, a Cornu, a Clothoid, a Cotes, a Fermat, a parabolic, a lituus, a Poinsot, a reciprocal, a hyperbolic, a logarithmic, or a sinusoidal spiral forming a spiral antenna. However, the design of the resonating antenna 850 is non-limiting. As another example, the resonating antenna 850 can be a single-coil arc plate, a double-coil arc plate, or a unibody arc plate.

In embodiments, a non-conductive structure (e.g., a non-conductive plate with cutouts to hold the first coil 852 and the second coil 854) provides structural support to arrange the first coil 852 and the second coil 854.

In embodiments, vertical non-conductive structures 880 (e.g., non-conductive offsets perpendicular to the first coil 852 and the second coil 854) are structurally coupled to the first coil 852 and the second coil 854. In embodiments, horizontal non-conductive structures 882 provide structural support to separate the spirals of each coil at an equidistance along the spiral structures. In embodiments, the second ends 860, 862 of the first coil 852 and the second coil 854, respectively, are floating. The vertical non-conductive structures 880 and the horizontal non-conductive structures 882 may be arranged on any position along the length of the first coil 852, the second coil 854, or both. In embodiments, the vertical non-conductive structures 880 are configurable to vertically adjust the first plane 874 on which the resonating antenna 850 is arranged with respect (substantially parallel) to the top cover 105 of the plasma chamber 106. In embodiments, each of the first coil 852 and the second coil 854 includes a wire arranged in a spiral configuration. The first end of the wire of each of the first coil 852 and the second coil 854 is couplable to a respective terminal (i.e., terminals 308 and 310) of circuit 300.

Resonating antenna 850 is arranged as a dual spiral quarter-wavelength resonator, where terminals 856, 858 of each coil 852, 854 are couplable to the balun 302, and a second end 860, 862 of each coil 852, 854 is left as an open circuit. A quarter-wavelength resonator exhibits resonance at discrete frequencies corresponding to L (the physical length of each coil 852, 854) equal to a multiple of one-quarter of a wavelength ($\lambda$) or $$L = n \times \frac{\lambda}{4},$$

where n is a whole number.

Here, the frequency corresponds to the frequency of the RF wave directed from the RF source 102 couplable to the resonating antenna 850. In embodiments, the physical length of the first coil 852 is substantially equal to the physical length of the second coil 854. In other embodiments, the physical length of the first coil 852 is different from the physical length of the second coil 854.

In the various embodiments of FIGS. 4-8B, the resonating antenna is advantageously configured to operate with only a single RF source. Each respective resonating antenna includes dual spiral single-pole antennas having a first inner ring nested adjacent and within a second outer ring. Each of the dual spiral single-pole antennas operates as a quarter-wavelength resonator. In these embodiments, the balanced design of the feed and resonating structure introduces maxima voltages at the inner coil sections. Further, in these embodiments, the inner coil section is 180 degrees out of phase from the outer coil section. Advantageously, the embodiments of this disclosure provide balanced currents to the resonating antennas, which improves plasma uniformity within the plasma chamber 106. Moreover, the dimensions, structure, and material of the third coil, nested within the first and second spiral resonant antennas for each resonating antenna, is selected (i.e., tuned) based on the different arrangements of the dual spiral resonant antennas in each configuration of the resonating antenna disclosed herein.

FIG. 9A illustrates a schematic of an embodiment voltage balun transformer 900, which may be arranged as the balun 302 in circuit 300. The voltage balun transformer 900 includes a first winding 901 and a second winding 903. In embodiments, first winding 901 includes a first coil 902, and second winding 903 includes a second coil 904 and a third coil 906. A first unbalanced terminal 908 and a second unbalanced terminal 910 of the voltage balun transformer 900, at the ends of the first coil 902, are couplable to the matching circuit 103 at terminals 316 and 318 of circuit 300. Second coil 904 and third coil 906 are couplable to the radiating antenna 104 at balanced terminals 912 and 914, respectively. In embodiments, one of the unbalanced terminals 908 or 910 is coupled to a reference ground.

In embodiments, the first coil 902 has the same number of turns as the combined number of turns in the second coil 904 and the third coil 906. In embodiments, the second coil 904 and the third coil 906 have the same number of turns. In embodiments, the second coil 904 and the third coil 906 share an iron core. As shown, the shared node 916 between the second coil 904 and the third coil 906 is coupled to the reference ground. However, it should be understood that the shared node 916, in embodiments, may also be floating.

FIG. 9B illustrates a schematic of an embodiment current balun transformer 930, which may be arranged as the balun 302 in circuit 300. The current balun transformer 930 includes a first winding 931 and a second winding 933. In embodiments, first winding 931 includes a first coil 932 and the second winding 933 includes a second coil 934. A first unbalanced terminal 940 and a second unbalanced terminal 942 of the current balun transformer 930 at the ends of the first coil 932 and the second coil 934, respectively, are couplable to the matching circuit 103 at terminals 316 and 318 of circuit 300. The first coil 932 and the second coil 934 are couplable to the radiating antenna 104 at balanced terminals 936 and 938, respectively. In embodiments, one of the unbalanced terminals 940 or 942 is coupled to a reference ground. In embodiments, the first coil 932 has the same number of turns as the second coil 934.

Figure 10:
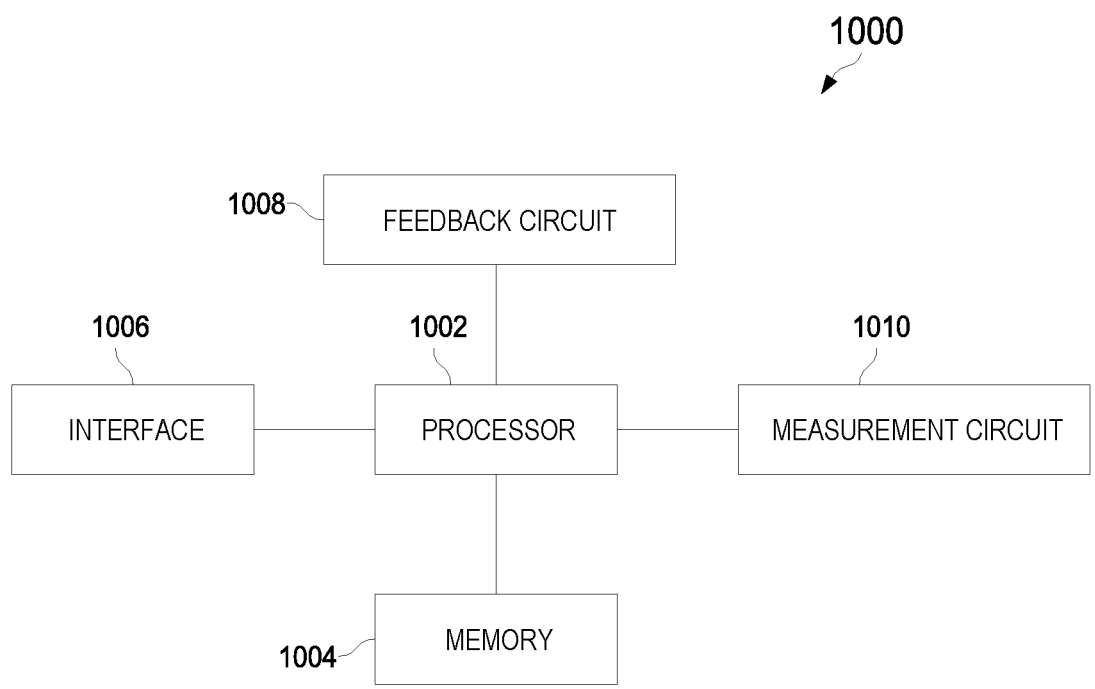
FIG. 10 illustrates a block diagram of an embodiment processing system.

FIG. 10 illustrates a block diagram of an embodiment processing system 1000, which may be coupled to the plasma processing system 100. As shown, the processing system 1000 includes a processor 1002, a memory 1004, an interface 1006, an optional feedback circuit 1008, and an optional measurement circuit 1010, which may (or may not) be arranged as shown. The processing system 1000 may include additional components not depicted, such as long-term storage (e.g., non-volatile memory, etc.), measurement devices, and the like. Although the processing system 1000 is shown to have one of each component (i.e., the processor 1002, the memory 1004, etc.), the number of components is not limiting and greater numbers are similarly contemplated in other embodiments. In such embodiments, the task performed by the component disclosed herein may be spread through these additional components.

Processor 1002 may be any component or collection of components adapted to perform computations or other processing-related tasks. Memory 1004 may be any component or collection of components adapted to store programming or instructions for execution by the processor 1002. In an embodiment, memory 1004 includes a non-transitory computer-readable medium.

Interface 1006 may be any component or collection of components that allow the processor 1002 to communicate with other devices/components or a user. For example, interface 1006 may be adapted to communicate data, control, or management messages from processor 1002 to a structure or circuit coupled to an actuator to adjust the vertical position of the radiating antenna 104 with respect to the plasma chamber or to adjust the configuration of the matching circuit 103, balun 302, or capacitors 304, 306 based on instructions or configurations stored in memory 1004. As another example, interface 1006 may be adapted to allow a user or device (e.g., personal computer (PC), etc.) to interact/communicate with the processing system 1000.

The feedback circuit 1008 may be used to receive measurements from the measurement circuit 1010 to automatically or manually change, through processor 1002, the configuration of the matching circuit 103, balun 302, or capacitors 304, 306 in the plasma processing system 100. The measurement circuit 1010 may be used to measure, for example, the plasma stability, pressure, ignition stability, density, or the like.

A first aspect relates to a plasma processing system. The plasma processing system includes a plasma chamber, an RF source, a matching circuit, a balun, and a resonating antenna. The RF source is configured to generate a forward RF wave. The matching circuit is coupled to the RF source and is configured to provide matching for the RF source. The balun includes unbalanced terminals coupled to the matching circuit. The resonating antenna is configured to generate plasma within the plasma chamber and includes a first spiral resonant antenna and a second spiral resonant antenna. The first spiral resonant antenna has an electrical length corresponding to a quarter of a wavelength of a frequency of the forward RF wave, a first end and a second end. The first end is coupled to a first balanced terminal of the balun and the second end is an open circuit. The second spiral resonant antenna has an electrical length corresponding to a quarter of the wavelength of the frequency of the forward RF wave, a first end and a second end. The first end is coupled to a second balanced terminal of the balun and the second end is an open circuit. The first spiral resonant antenna and the second spiral resonant antenna are arranged in a symmetrically nested configuration having the same center point.

In a first implementation form of the plasma processing system, according to the first aspect as such, the first end of the first spiral resonant antenna and the first end of the second spiral resonant antenna are arranged 180 degrees with respect to the center point.

In a second implementation form of the plasma processing system, according to the first aspect as such or any preceding implementation of the first aspect, the first spiral resonant antenna is 180 degrees out of phase from the second spiral resonant antenna.

In a third implementation form of the plasma processing system, according to the first aspect as such or any preceding implementation of the first aspect, an entirety of the first spiral resonant antenna is arranged within an interior portion of the second spiral resonant antenna.

In a fourth implementation form of the plasma processing system, according to the first aspect as such or any preceding implementation of the first aspect, the first end of the first spiral resonant antenna and the first end of the second spiral resonant antenna are on a first plane. The second end of the first spiral resonant antenna and the second end of the second spiral resonant antenna are on a second plane different from the first plane.

In a fifth implementation form of the plasma processing system, according to the first aspect as such or any preceding implementation of the first aspect, the resonating antenna further includes a coil symmetrically nested within an interior portion of the first spiral resonant antenna and an interior portion of the second spiral resonant antenna. The coil's first and second ends are coupled to RF ground.

In a sixth implementation form of the plasma processing system, according to the first aspect as such or any preceding implementation of the first aspect, the balun is a voltage balun transformer or a current balun transformer.

A second aspect relates to a resonating antenna for generating plasma within a plasma chamber. The resonating antenna includes a first spiral resonant antenna having an electrical length corresponding to a quarter of a wavelength of a frequency of a forward RF wave fed by an RF source couplable to the resonating antenna. The first spiral resonant antenna has a first end and a second end. The first end couplable to a first balanced terminal of a balun and the second end is an open circuit. The second spiral resonant antenna has an electrical length corresponding to a quarter of the wavelength of the frequency of the forward RF wave. The second spiral resonant antenna has a first and second end, the first end couplable to a second balanced terminal of the balun and the second end is an open circuit. The first spiral resonant antenna and the second spiral resonant antenna are arranged in a symmetrically nested configuration having the same center point.

In a first implementation form of the resonating antenna, according to the second aspect as such, the first spiral resonant antenna and the second spiral resonant antenna are arranged in a braided configuration.

In a second implementation form of the resonating antenna, according to the second aspect as such or any preceding implementation of the second aspect, the first spiral resonant antenna is 180 degrees out of phase from the second spiral resonant antenna.

In a third implementation form of the resonating antenna, according to the second aspect as such or any preceding implementation of the second aspect, an entirety of the first spiral resonant antenna is arranged within an interior portion of the second spiral resonant antenna.

In a fourth implementation form of the resonating antenna, according to the second aspect as such or any preceding implementation of the second aspect, the first end of the first spiral resonant antenna and the first end of the second spiral resonant antenna are on a first plane. The second end of the first spiral resonant antenna and the second end of the second spiral resonant antenna are on a second plane different from the first plane.

In a fifth implementation form of the resonating antenna, according to the second aspect as such or any preceding implementation of the second aspect, the resonating antenna further includes a coil symmetrically nested within an interior portion of the first spiral resonant antenna and an interior portion of the second spiral resonant antenna. The coil's first and second ends are coupled to RF ground.

In a sixth implementation form of the resonating antenna, according to the second aspect as such or any preceding implementation of the second aspect, the first end of the first spiral resonant antenna is an end of the first spiral resonant antenna nearest to the center point. The first end of the second spiral resonant antenna is the end of the second spiral resonant antenna nearest to the center point.

A third aspect relates to an apparatus for generating plasma in a plasma chamber of a plasma processing system. The apparatus includes an RF source configured to generate a forward RF wave; a matching circuit coupled to the RF source, the matching circuit configured to provide matching for the RF source; a balun having unbalanced terminals coupled to the matching circuit; a resonating antenna, the resonating antenna configured to generate plasma within the plasma chamber, the resonating antenna having: a first spiral resonant antenna having an electrical length corresponding to a quarter of a wavelength of a frequency of the forward RF wave, the first spiral resonant antenna having a first end and a second end, the first end coupled to a first balanced terminal of the balun and the second end that is open circuit, and a second spiral resonant antenna having an electrical length corresponding to the quarter of the wavelength of the frequency of the forward RF wave, the second spiral resonant antenna having a first end and a second end, the first end coupled to a second balanced terminal of the balun and the second end that is open circuit, wherein the first spiral resonant antenna and the second spiral resonant antenna are arranged in a symmetrically nested configuration having a same center point; a non-transitory memory storage comprising instructions; and a processor in communication with the non-transitory memory storage and coupled to the matching circuit, wherein the instructions, when executed by the processor, cause the processor to provide a matching impedance between the RF source and the resonating antenna.

In a first implementation form of the apparatus, according to the third aspect as such, the first spiral resonant antenna is 180 degrees out of phase from the second spiral resonant antenna.

In a second implementation form of the apparatus, according to the third aspect as such or any preceding implementation of the third aspect, an entirety of the first spiral resonant antenna is arranged within an interior portion of the second spiral resonant antenna.

In a third implementation form of the apparatus, according to the third aspect as such or any preceding implementation of the third aspect, the first end of the first spiral resonant antenna and the first end of the second spiral resonant antenna are on a first plane. The second end of the first spiral resonant antenna and the second end of the second spiral resonant antenna are on a second plane different from the first plane.

In a fourth implementation form of the apparatus, according to the third aspect as such or any preceding implementation of the third aspect, the resonating antenna further includes a coil symmetrically nested within an interior portion of the first spiral resonant antenna and an interior portion of the second spiral resonant antenna. The coil's first and second ends are coupled to RF ground.

In a fifth implementation form of the apparatus, according to the third aspect as such or any preceding implementation of the third aspect, the balun is a voltage balun transformer or a current balun transformer.

It is noted that all steps outlined in the disclosure are not necessarily required and can be optional. Further, changes to the arrangement of the steps, removal of one or more steps and path connections, and addition of steps and path connections are similarly contemplated.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A plasma processing system, comprising:
    a plasma chamber;
    an RF source configured to generate a forward RF wave;
    a matching circuit coupled to the RF source, the matching circuit configured to provide matching for the RF source;
    a balun having unbalanced terminals coupled to the matching circuit; and
    a resonating antenna, the resonating antenna configured to generate plasma within the plasma chamber, the resonating antenna having:
        a first spiral resonant antenna having an electrical length corresponding to a quarter of a wavelength of a frequency of the forward RF wave, the first spiral resonant antenna having a first end and a second end, the first end coupled to a first balanced terminal of the balun and the second end that is open circuit, and
        a second spiral resonant antenna having an electrical length corresponding to the quarter of the wavelength of the frequency of the forward RF wave, the second spiral resonant antenna having a first end and a second end, the first end coupled to a second balanced terminal of the balun and the second end that is open circuit, wherein the first spiral resonant antenna and the second spiral resonant antenna are arranged in a symmetrically nested configuration having a same center point.

2. The plasma processing system of claim 1, wherein the first end of the first spiral resonant antenna and the first end of the second spiral resonant antenna are arranged 180 degrees with respect to the center point.

3. The plasma processing system of claim 1, wherein the first spiral resonant antenna is 180 degrees out of phase from the second spiral resonant antenna.

4. The plasma processing system of claim 1, wherein an entirety of the first spiral resonant antenna is arranged within an interior portion of the second spiral resonant antenna.

5. The plasma processing system of claim 1, wherein the first end of the first spiral resonant antenna and the first end of the second spiral resonant antenna are on a first plane, and wherein the second end of the first spiral resonant antenna and the second end of the second spiral resonant antenna are on a second plane different from the first plane.

6. The plasma processing system of claim 1, wherein the resonating antenna further includes a coil symmetrically nested within an interior portion of the first spiral resonant antenna and an interior portion of the second spiral resonant antenna, and wherein a first end and a second end of the coil are coupled to RF ground.

7. The plasma processing system of claim 1, wherein the balun is a voltage balun transformer or a current balun transformer.

8. A resonating antenna for generating plasma within a plasma chamber, the resonating antenna comprising:
    a first spiral resonant antenna having an electrical length corresponding to a quarter of a wavelength of a frequency of a forward RF wave fed by an RF source couplable to the resonating antenna, the first spiral resonant antenna having a first end and a second end, the first end couplable to a first balanced terminal of a balun and the second end that is open circuit, and
    a second spiral resonant antenna having an electrical length corresponding to the quarter of the wavelength, the second spiral resonant antenna having a first end and a second end, the first end couplable to a second balanced terminal of the balun and the second end that is open circuit, wherein the first spiral resonant antenna and the second spiral resonant antenna are arranged in a symmetrically nested configuration having a same center point.

9. The resonating antenna of claim 8, wherein the first spiral resonant antenna and the second spiral resonant antenna are arranged in a braided configuration.

10. The resonating antenna of claim 8, wherein the first spiral resonant antenna is 180 degrees out of phase from the second spiral resonant antenna.

11. The resonating antenna of claim 8, wherein an entirety of the first spiral resonant antenna is arranged within an interior portion of the second spiral resonant antenna.

12. The resonating antenna of claim 8, wherein the first end of the first spiral resonant antenna and the first end of the second spiral resonant antenna are on a first plane, and wherein the second end of the first spiral resonant antenna and the second end of the second spiral resonant antenna are on a second plane different from the first plane.

13. The resonating antenna of claim 8, further comprising a coil symmetrically nested within an interior portion of the first spiral resonant antenna and an interior portion of the second spiral resonant antenna, and wherein a first end and a second end of the coil are coupled to RF ground.

14. The resonating antenna of claim 8, wherein the first end of the first spiral resonant antenna is an end of the first spiral resonant antenna nearest to the center point, and wherein the first end of the second spiral resonant antenna is an end of the second spiral resonant antenna nearest to the center point.

15. An apparatus for generating plasma in a plasma chamber of a plasma processing system, the apparatus comprising:
- an RF source configured to generate a forward RF wave;
- a matching circuit coupled to the RF source, the matching circuit configured to provide matching for the RF source;
- a balun having unbalanced terminals coupled to the matching circuit;
- a resonating antenna, the resonating antenna configured to generate plasma within the plasma chamber, the resonating antenna having:
  - a first spiral resonant antenna having an electrical length corresponding to a quarter of a wavelength of a frequency of the forward RF wave, the first spiral resonant antenna having a first end and a second end, the first end coupled to a first balanced terminal of the balun and the second end that is open circuit, and
  - a second spiral resonant antenna having an electrical length corresponding to the quarter of the wavelength of the frequency of the forward RF wave, the second spiral resonant antenna having a first end and a second end, the first end coupled to a second balanced terminal of the balun and the second end that is open circuit, wherein the first spiral resonant antenna and the second spiral resonant antenna are arranged in a symmetrically nested configuration having a same center point;
- a non-transitory memory storage comprising instructions; and
- a processor in communication with the non-transitory memory storage and coupled to the matching circuit, wherein the instructions, when executed by the processor, cause the processor to provide a matching impedance between the RF source and the resonating antenna.

16. The apparatus of claim 15, wherein the first spiral resonant antenna is 180 degrees out of phase from the second spiral resonant antenna.

17. The apparatus of claim 15, wherein an entirety of the first spiral resonant antenna is arranged within an interior portion of the second spiral resonant antenna.

18. The apparatus of claim 15, wherein the first end of the first spiral resonant antenna and the first end of the second spiral resonant antenna are on a first plane, and wherein the second end of the first spiral resonant antenna and the second end of the second spiral resonant antenna are on a second plane different from the first plane.

19. The apparatus of claim 15, wherein the resonating antenna further includes a coil symmetrically nested within an interior portion of the first spiral resonant antenna and an interior portion of the second spiral resonant antenna, and wherein a first end and a second end of the coil are coupled to RF ground.

20. The apparatus of claim 15, wherein the balun is a voltage balun transformer or a current balun transformer.

* * * * *